US 12,495,633 B2

(12) United States Patent
Kim et al.

(10) Patent No.: US 12,495,633 B2
(45) Date of Patent: Dec. 9, 2025

(54) SEMICONDUCTOR PACKAGE INCLUDING STACK STRUCTURE OF LOGIC CHIP AND SENSING CHIPS

(71) Applicant: Samsung Electronics Co., Ltd., Suwon-si (KR)

(72) Inventors: Kyungkyu Kim, Suwon-si (KR); Dong-Hun Lee, Hwaseong-si (KR); Woonbae Kim, Seoul (KR); Daeho Lee, Hwaseong-si (KR); Jungpil Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 737 days.

(21) Appl. No.: 17/745,010

(22) Filed: May 16, 2022

(65) Prior Publication Data

US 2022/0367553 A1     Nov. 17, 2022

(30) Foreign Application Priority Data

May 17, 2021   (KR) .................. 10-2021-0063391

(51) Int. Cl.
*H10F 39/00*     (2025.01)
*H10F 39/18*     (2025.01)

(52) U.S. Cl.
CPC ......... *H10F 39/809* (2025.01); *H10F 39/182* (2025.01); *H10F 39/8053* (2025.01); *H10F 39/811* (2025.01)

(58) Field of Classification Search
CPC ......... H01L 27/14634; H01L 27/14621; H01L 27/14636; H01L 27/14645; H01L 25/0657;

(Continued)

(56) References Cited

U.S. PATENT DOCUMENTS 7,071,567 B2   7/2006  Koizumi
7,172,923 B2   2/2007  Misawa
(Continued)

FOREIGN PATENT DOCUMENTS

CN   109346491 A   *  2/2019   ....... H01L 27/14601
KR   101614163 B1     4/2016

OTHER PUBLICATIONS

English translation of "CN 109346491 A" Wang et al, "Semiconductor device and manufacturing method thereof", Feb. 15, 2019 (Year: 2019).*

*Primary Examiner* — Eva Y Montalvo
*Assistant Examiner* — Nicholas B Michaud
(74) *Attorney, Agent, or Firm* — Harness, Dickey & Pierce, P.L.C.

(57) ABSTRACT

A semiconductor package including a substrate including a through hole, an image sensor structure on the substrate, and a first transparent substrate on the substrate and spaced apart from the image sensor structure may be provided. The image sensor structure includes a logic chip on the substrate, a first sensing chip on an active surface of the logic chip, and a second sensing chip on an inactive surface of the logic chip and connected to the active surface of the logic chip through a first via that vertically penetrates the logic chip. On a bottom surface of the logic chip, at least a portion of one of the first sensing chip and the second sensing chip is in the through hole.

15 Claims, 11 Drawing Sheets

(58) Field of Classification Search
CPC ......... H01L 23/13; H01L 23/31; H01L 23/58; H01L 25/18; H01L 27/14618; H01L 2225/06541
USPC .......................................................... 257/72
See application file for complete search history.

(56) References Cited

U.S. PATENT DOCUMENTS

| | | | |
|---|---|---|---|
| 7,539,412 | B2 | 5/2009 | Lee et al. |
| 8,497,536 | B2 | 7/2013 | Chen et al. |
| 9,202,963 | B2 | 12/2015 | Liu et al. |
| 10,237,475 | B2 | 3/2019 | Wang et al. |
| 10,541,263 | B2 | 1/2020 | Kim et al. |
| 2006/0091290 | A1* | 5/2006 | Yoshihara ........... H01L 27/1464 257/E31.117 |
| 2013/0285183 | A1* | 10/2013 | Chen ................. H01L 27/14645 257/432 |
| 2014/0070349 | A1* | 3/2014 | Oganesian ........... H10F 39/024 257/432 |
| 2015/0091124 | A1* | 4/2015 | Liu ................... H01L 27/14636 257/459 |
| 2018/0138225 | A1* | 5/2018 | Kim ..................... H01L 21/565 |
| 2018/0301443 | A1* | 10/2018 | Kim ..................... H01L 23/367 |

\* cited by examiner

SEMICONDUCTOR PACKAGE INCLUDING STACK STRUCTURE OF LOGIC CHIP AND SENSING CHIPS

CROSS-REFERENCE TO RELATED APPLICATION

This U.S. nonprovisional application claims priority under 35 U.S.C § 119 to Korean Patent Application No. 10-2021-0063391, filed on May 17, 2021, in the Korean Intellectual Property Office, the disclosure of which is hereby incorporated by reference in its entirety.

BACKGROUND

1. Field

The present inventive concepts relate to semiconductor packages, and more particularly, to semiconductor packages including an image sensor.

2. Description of the Related Art

In general, an image sensor is a semiconductor device that converts optical images into electrical signals. The image sensor is broadly classified into a charge coupled device (CCD) type image sensor and a complementary metal oxide silicon (CMOS) type image sensor (also referred to as CIS).

Recent advances in computer and communication industries have led to strong demands in high-performance image sensors in various consumer electronic devices such as digital cameras, camcorders, PCSs (Personal Communication Systems), game devices, security cameras, medical micro cameras, etc. A plurality of image sensors have recently been used in portable electronic devices, and thus the plurality of image sensors are integrated and utilized in the devices.

In the semiconductor industry, high capacity, thinness, and compactness of semiconductor devices and electronic products using the same have been demanded and thus various package techniques have been suggested.

SUMMARY

Some example embodiments of the present inventive concepts may provide semiconductor packages including a double-sided image sensor.

Some example embodiments of the present inventive concepts may provide compact-sized semiconductor packages.

Some example embodiments of the present inventive concepts may provide semiconductor packages with improved electrical properties.

According to an example embodiment, a semiconductor package includes a substrate including a through hole, an image sensor structure on the substrate, and a first transparent substrate on the substrate and spaced apart from the image sensor structure. The image sensor structure includes a logic chip on the substrate, a first sensing chip on an active surface of the logic chip, and a second sensing chip on an inactive surface of the logic chip and connected to the active surface of the logic chip through a first via that vertically penetrates the logic chip. On a bottom surface of the logic chip, one of the first sensing chip and the second sensing chip is in the through hole.

According to an example embodiment, a semiconductor package includes a substrate having a through hole and a recess region, the through hole penetrating the substrate, the recess region being on a lower portion of the substrate, a logic chip on the substrate and covering the through hole, a first sensing chip on the logic chip, a second sensing chip below the logic chip and positioned in the through hole, a first transparent substrate on the substrate, a spacer between the substrate and the first transparent substrate, the spacer separating the first transparent substrate and the first sensing chip from each other, and a second transparent substrate in the recess region of the substrate. One of the first sensing chip and the second sensing chip is connected to an active surface of the logic chip through a first via that vertically penetrates the logic chip. The other of the first sensing chip and the second sensing chip is on the active surface of the logic chip.

According to an example embodiment, a semiconductor package includes a substrate, a chip stack on the substrate, and a first transparent substrate on the chip stack. The chip stack includes a first semiconductor chip on a top surface of the substrate, a second semiconductor chip on the first semiconductor chip, the second semiconductor chip on an active surface of the first semiconductor chip; and a third semiconductor chip below the first semiconductor chip, the third semiconductor chip penetrating a central portion of the substrate and being exposed by a bottom surface of the substrate. A first pad of the first semiconductor chip is in direct contact with a second pad of the second semiconductor chip. The third semiconductor chip is coupled to the active surface of the first semiconductor chip through a first via that vertically penetrates the first semiconductor chip. The first semiconductor chip includes a logic chip. The second semiconductor chip includes an image sensing chip.

DETAILED DESCRIPTION

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

The following will now describe a semiconductor package according to the present inventive concepts with reference to the accompanying drawings.

Figure 1:
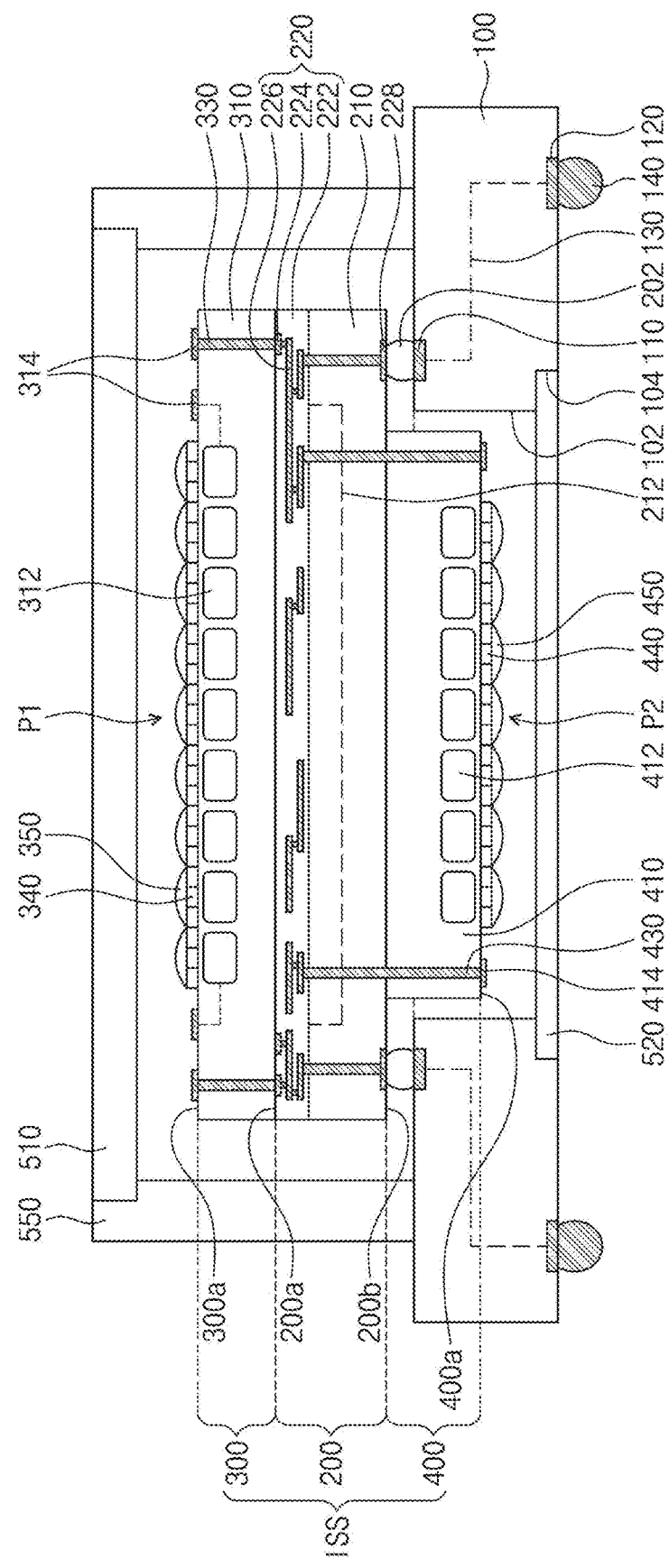
FIGS. 1 to 11 are cross-sectional views illustrating semiconductor packages according to an example embodiment of the present inventive concepts.
Figure 2:
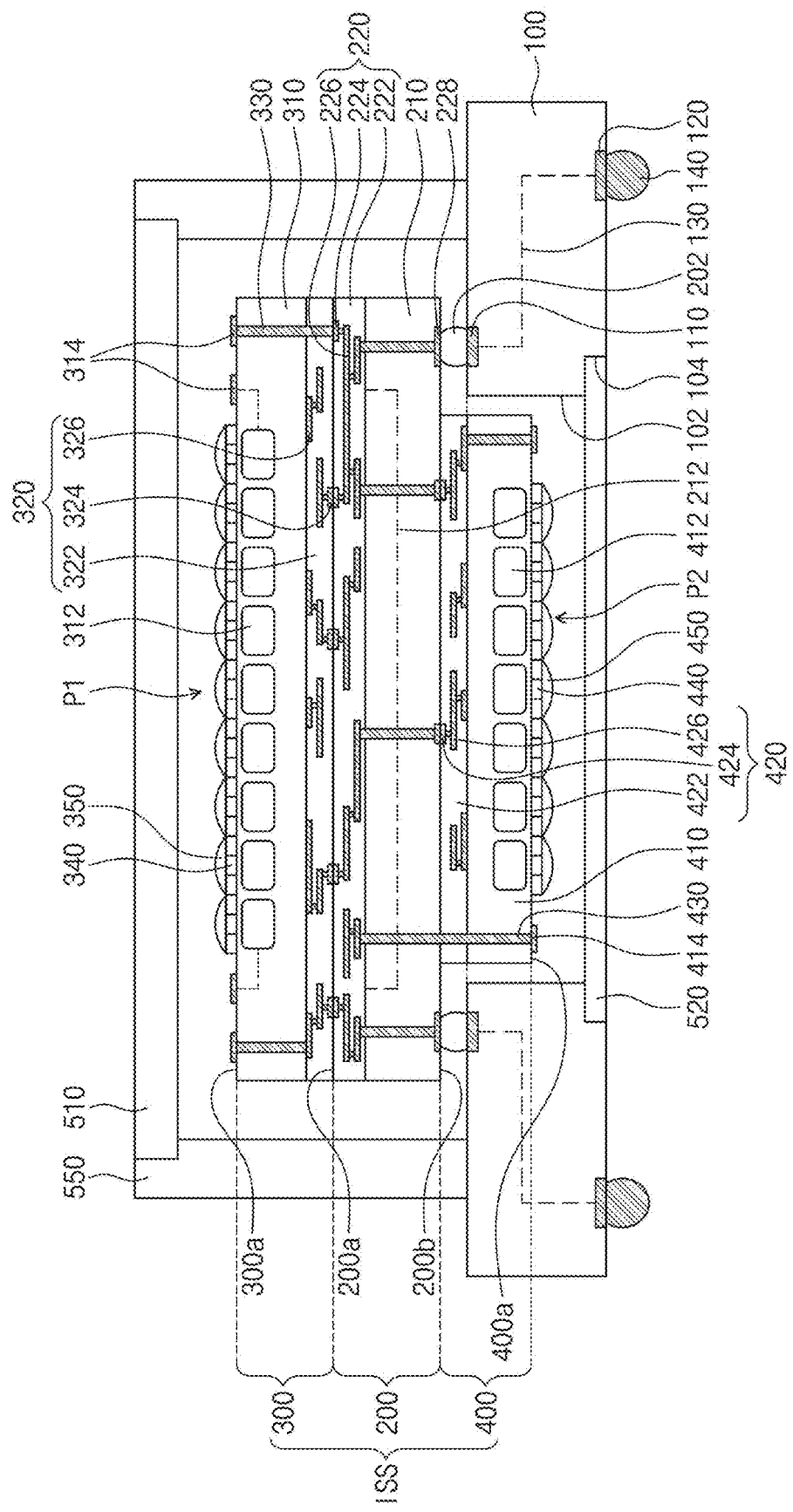
Figure 3:
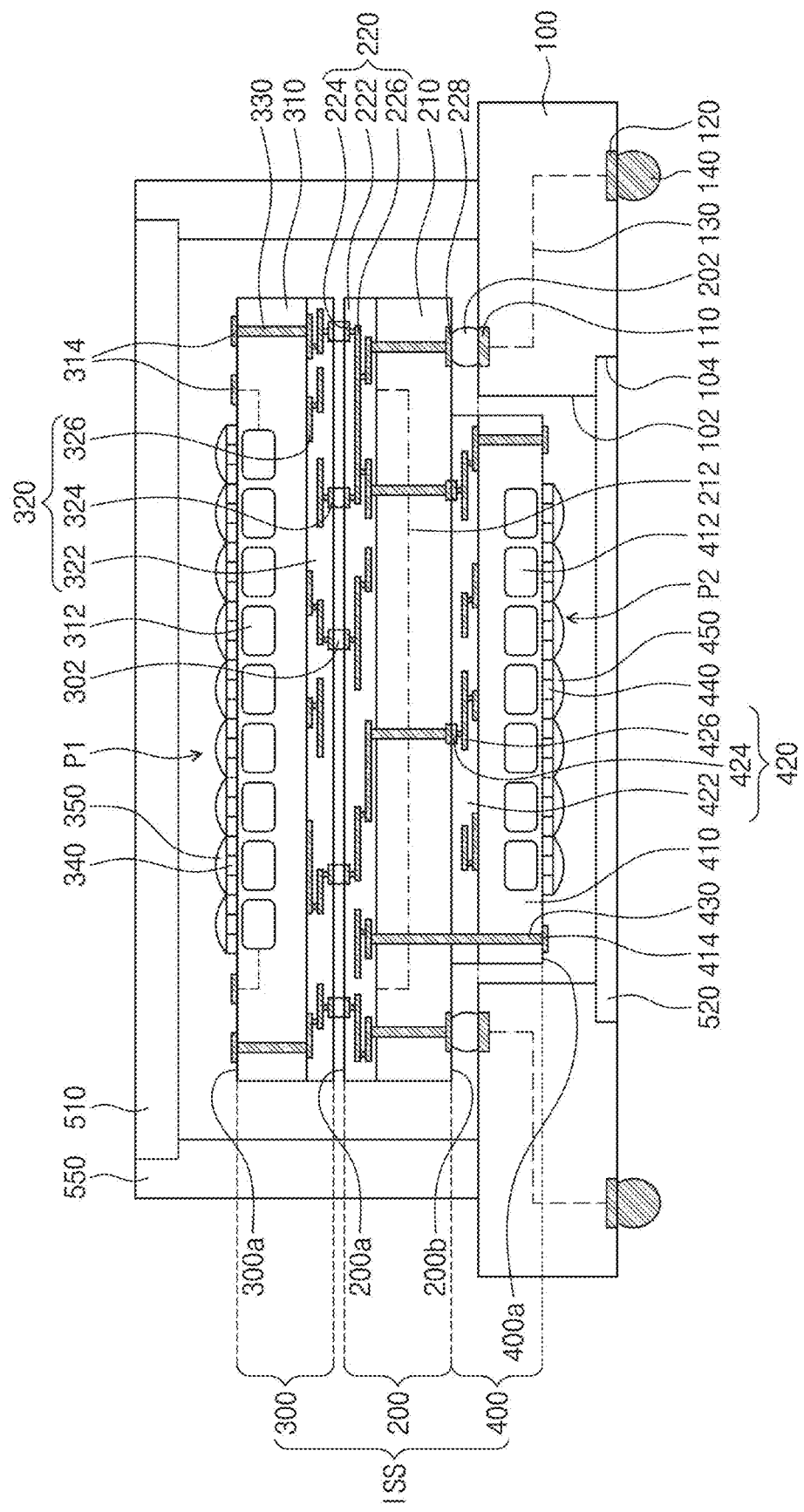

FIGS. 1 to 3 are cross-sectional views illustrating semiconductor packages according to some example embodiments of the present inventive concepts.

Referring to FIG. 1, a substrate 100 may be provided. The substrate 100 may include a printed circuit board (PCB).

The substrate 100 may have a through hole 102 that penetrates the substrate 100. For example, the through hole 102 may be shaped like an open hole that connects top and bottom surfaces of the substrate 100. The through hole 102 may be positioned at a central portion of the substrate 100. The through hole 102 may correspond to an area on which a third semiconductor chip 400 is provided. When viewed in a plan view, the through hole 102 may have a planar shape that corresponds to that of the third semiconductor chip 400 which will be discussed below. For example, the planar shape of the through hole 102 may be a tetragon. No limitation is imposed on the planar shape of the through hole 102, and the through hole 102 may have any other suitable shape such as a circular shape. The substrate 100 may have a thickness of about 200 μm to about 500 μm.

The substrate 100 may have a recess region 104 located on the bottom surface of the substrate 100. For example, the recess region 104 may be formed to extend from the bottom toward the top surface of the substrate 100. The recess region 104 may be in contact with and connected to the through hole 102. For example, the recess region 104 may have a shape that extends from the through hole 102 toward a lateral surface of the substrate 100. For example, when viewed in a plan view, the recess region 104 may surround the through hole 102. In this case, the recess region 104 may have an annular shape in contact with an outer side of the through hole 102. From a different perspective, the recess region 104 may have a width greater than that of the through hole 102. In this case, the through hole 102 may be in connection with and vertically penetrate the recess region 104. The recess region 104 may correspond to an area on which is provided a second transparent substrate 520, which will be discussed below.

In some example embodiments, the recess region 104 may be provided in plural. For example, the recess regions 104 may be located along the outer side of the through hole 102. In this case, the recess regions 104 may be connected to at least two of inner lateral surfaces of the through hole 102. According to some example embodiments of the present inventive concepts, the recess region 104 may be provided to have any suitable shape capable of fixing the second transparent substrate 520.

The substrate 100 may have first substrate pads 110 provided on the top surface of the substrate 100, and may also have second substrate pads 120 provided on the bottom surface of the substrate 100. The first substrate pads 110 and the second substrate pads 120 may be located outside the through hole 102 and the recess region 104. For example, the first substrate pads 110 may be disposed outside the through hole 102, and the second substrate pads 120 may be disposed outside the recess region 104. The first substrate pads 110 may be electrically connected to the second substrate pads 120 through substrate internal lines 130 provided in the substrate 100. In this disclosure, the phrase "electrically connected to" may include a meaning of "directly or indirectly electrically connected to."

External terminals 140 may be provided on the bottom surface of the substrate 100. The external terminals 140 may be coupled to the second substrate pads 120. The external terminals 140 may include solder balls or solder bumps.

The substrate 100 may be provided thereon with an image sensor structure ISS. The image sensor structure ISS may include a third semiconductor chip 400, a first semiconductor chip 200, and a second semiconductor chip 300 that are sequentially stacked. The image sensor structure ISS may be a bidirectional image sensor. For example, the second semiconductor chip 300 and the third semiconductor chip 400 may each be an image sensing chip that detects light incident from opposite directions. The first semiconductor chip 200 may be, for example, a logic chip that processes signals of the second and third semiconductor chips 300 and 400.

The first semiconductor chip 200 may be located on the substrate 100. The first semiconductor chip 200 may cover the through hole 102. For example, when viewed in a plan view, the through hole 102 may be positioned below a central portion of the first semiconductor chip 200. The first semiconductor chip 200 may have a width greater than that of the through hole 102. Therefore, the central portion of the first semiconductor chip 200 may overlap the through hole 102, and an outer portion of the first semiconductor chip 200 may overlap the substrate 100. The first semiconductor chip 200 may have a thickness of about 100 μm to about 200 μm.

The first semiconductor chip 200 may include a first base layer 210 and a first circuit layer 220.

The first base layer 210 may include a silicon (Si) substrate. The first base layer 210 may include a first integrated circuit 212 or circuits such as transistors, and may also include wiring patterns connected to the circuits. The first integrated circuit 212 may be provided on a top surface of the first base layer 210. For example, the first semiconductor chip 200 may be disposed in a face-up state where an active surface 200a of the first semiconductor chip 200 is directed away from the substrate 100. A top surface of the first semiconductor chip 200 may be the active surface 200a, and a bottom surface of the first semiconductor chip 200 may be an inactive surface 200b that is opposite to the top surface. In this disclosure below, the reference numeral 200a may indicate an active surface of the first semiconductor chip 200, and the reference numeral 200b may indicate an inactive surface of the first semiconductor chip 200. The active and inactive surfaces 200a and 200b may change positions with each other. The first integrated circuit 212 may include a logic circuit. For example, the first semiconductor chip 200 may be a logic chip.

The first circuit layer 220 may be provided on the first base layer 210. The first circuit layer 220 may include a first dielectric layer 222, first chip pads 224, and first chip lines 226.

The first dielectric layer 222 may cover the top surface of the first base layer 210. The first dielectric layer 222 may include a dielectric material. For example, the first dielectric layer 222 may include silicon oxide (SiO), silicon nitride (SiN), or silicon oxynitride (SiON).

The first chip pads 224 may be provided on an upper portion of the first dielectric layer 222. The first chip pads 224 may be exposed on a top surface of the first dielectric layer 222. In this case, the first chip pads 224 may have their top surfaces coplanar with that of the first dielectric layer 222. The first chip pads 224 may include a conductive material. For example, the first chip pads 224 may include copper (Cu).

The first chip lines 226 may be provided in the first dielectric layer 222. The first dielectric layer 222 may electrically connect the first chip pads 224 to the first integrated circuit 212 of the first base layer 210.

The first semiconductor chip 200 may be mounted on the substrate 100. For example, the first semiconductor chip 200 may include second chip pads 228 provided on the bottom surface of the first semiconductor chip 200, or the inactive surface 200b of the first semiconductor chip 200. The second chip pads 228 may be provided on a bottom surface of the first base layer 210. When viewed in a plan view, the second chip pads 228 may be located outside the through hole 102 and the recess region 104. The second chip pads 228 may be connected to the first chip lines 226 of the first circuit layer 220 through first vias 230 that vertically penetrate the first base layer 210. The first substrate pads 110 and the second chip pads 228 may be provided therebetween with first connection terminals 202. For example, the first connection terminals 202 may be provided between the substrate 100 and the first semiconductor chip 200, and when viewed in a plan view, the first connection terminals 202 may be provided outside the through hole 102 and the recess region 104. The first connection terminals 202 may connect the first substrate pads 110 to the second chip pads 228. The first semiconductor chip 200 may be electrically connected to the substrate 100 through the first vias 230 and the first connection terminals 202. In addition, the first connection terminals 202 may be used to support and couple the first semiconductor chip 200 to the substrate 100.

The second semiconductor chip 300 may be provided on the first semiconductor chip 200. The second semiconductor chip 300 may be located on the first circuit layer 220 of the first semiconductor chip 200. For example, the second semiconductor chip 300 may be disposed on the active surface 200a of the first semiconductor chip 200. The second semiconductor chip 300 may have the same width as that of the first semiconductor chip 200. The present inventive concepts, however, are not limited thereto, and the second semiconductor chip 300 may have a width less than that of the first semiconductor chip 200. The second semiconductor chip 300 may have a thickness of about 5 μm to about 20 μm.

The second semiconductor chip 300 may include a second base layer 310. The second base layer 310 may include a silicon (Si) substrate. The second base layer 310 may include first photodiodes 312 and a second integrated circuit (not shown). For example, the second semiconductor chip 300 may be an image sensing chip.

The first photodiodes 312 and the second integrated circuit may be provided on an upper portion of the second base layer 310. When viewed in a plan view, the first photodiodes 312 may be located on a central portion of the second base layer 310. The first photodiodes 312 may generate electrical signals from light that is incident through a first pixel array which will be discussed below.

The second integrated circuit may include circuits such as transistors, and may also include wiring patterns connected to the circuits. The second integrated circuit may process signals received from the first photodiodes 312.

The second semiconductor chip 300 may include third chip pads 314 on a top surface thereof, and the top surface of the second semiconductor chip 300 may serve as an active surface 300a. The third chip pads 314 may be exposed on a top surface of the second base layer 310. The third chip pads 314 may be electrically connected through the second integrated circuit to the first photodiodes 312.

A first pixel array may be provided on an upper portion of the second semiconductor chip 300. The first pixel array may include first pixels P1 provided on the first photodiodes 312 of the second base layer 310. When viewed in a plan view, the first pixels P1 may be provided on a central portion of the second semiconductor chip 300. The third chip pads 314 may be positioned outside the first pixel array.

The second semiconductor chip 300 may be provided on its top surface (e.g., the active surface 300a) with first color filters 340 and first microlenses 350 provided on corresponding first pixels P1. A single first color filter 340 and a single first microlens 350 may correspond to each of the first pixels P1. The first color filters 340 may include red, green, and blue (RGB) filters. In some example embodiments, the first color filters 340 may include a combination of filters that filter various colors.

The second semiconductor chip 300 may be mounted on the first semiconductor chip 200. For example, the second semiconductor chip 300 may be in contact with the top surface (e.g., the active surface 200a) of the first semiconductor chip 200. In this case, the second semiconductor chip 300 may have an inactive surface 300b in contact with the active surface 200a of the first semiconductor chip 200. The second semiconductor chip 300 may have second vias 330 that vertically penetrate the second semiconductor chip 300. For example, the second vias 330 may vertically penetrate the second base layer 310, and on the top surface (e.g., the active surface 300a) of the second semiconductor chip 300, the second vias 330 may be coupled to the third chip pads 314. The second vias 330 may extend toward a bottom surface of the second base layer 310 and may penetrate the second base layer 310, and on the bottom surface of the second semiconductor chip 300, the second vias 330 may be coupled to the first chip pads 224 of the first circuit layer 220 included in the first semiconductor chip 200. For example, the second vias 330 and the first chip pads 224 may be in contact with each other at an interface between the second semiconductor chip 300 and the first semiconductor chip 200. The second semiconductor chip 300 may be electrically connected through the second vias 330 to the first semiconductor chip 200.

In some example embodiments, the second semiconductor chip 300 may be bonded to the first semiconductor chip 200 in direct bonding manner. For example, a hybrid bonding may be made between the second base layer 310 of the second semiconductor chip 300 and the first dielectric layer 222 of the first circuit layer 220 included in the first semiconductor chip 200. In this disclosure, the hybrid bonding may mean that two components including the same material are merged with each other at an interface between the two components or that a first component including a first material and a second component including a second material (or a compound of the first material) are merged with each other at an interface between the first component and the second component. For example, the second base layer 310 and the first dielectric layer 222 may have a continuous configuration (e.g., a single body) and may have an invisible interface therebetween. For example, the second base layer 310 may include silicon (Si), and the first dielectric layer 222 may include silicon oxide, silicon nitride, or silicon oxynitride. The second base layer 310 and the first dielectric layer 222 may contact each other, and oxygen or nitrogen may diffuse from the first dielectric layer 222 into the second base layer 310. In this case, a concentration of oxygen or nitrogen may progressively decrease in a direction from the first dielectric layer 222 toward the second base layer 310. Therefore, the first dielectric layer 222 and the second base layer 310 may have a continuous configuration around an interface therebetween.

Differently from that shown, the second base layer 310 may include on its bottom surface a passivation layer including the same material as that of the first dielectric layer 222, and a continuous configuration may be provided between the passivation layer and the first dielectric layer 222. In this case, the passivation layer may include oxide, nitride, or oxynitride of a material identical to that of the second base layer 310, which material may be the same as that of the first dielectric layer 222.

Differently from that shown, an adhesion layer may be used to attach the second semiconductor chip 300 to the first semiconductor chip 200. For example, the adhesion layer may be interposed between the first circuit layer 220 of the first semiconductor chip 200 and the second base layer 310 of the second semiconductor chip 300. In this case, the second vias 330 may penetrate all of the second base layer 310 and the adhesion layer, thereby being coupled to the first circuit layer 220.

According to some example embodiments of the present inventive concepts, as a direct bonding is used to bond the first semiconductor chip 200 to the second semiconductor chip 300, the second semiconductor chip 300 may be rigidly coupled onto the first semiconductor chip 200. A semiconductor package may then have improved structural stability.

In addition, the second vias 330 may be used to directly connect the second semiconductor chip 300 to the active surface 200a of the first semiconductor chip 200, and thus a reduced electrical length may be provided between the first semiconductor chip 200 and the second semiconductor chip 300, which may result in an improvement in electrical properties.

According to some example embodiments, the second semiconductor chip 300 may further include a second circuit layer 320. As illustrated in FIG. 2, the second circuit layer 320 may be provided on the bottom surface of the second base layer 310, or the inactive surface of the second semiconductor chip 300. The second circuit layer 320 may include a second dielectric layer 322, fourth chip pads 324, and second chip lines 326.

The second dielectric layer 322 may cover the bottom surface of the second base layer 310. The second dielectric layer 322 may include a dielectric material. For example, the second dielectric layer 322 may include silicon oxide (SiO), silicon nitride (SiN), or silicon oxynitride (SiON).

The fourth chip pads 324 may be provided on a lower portion of the second dielectric layer 322. The fourth chip pads 324 may be exposed by a bottom surface of the second dielectric layer 322. In this case, the fourth chip pads 324 may have their bottom surfaces coplanar with that of the second dielectric layer 322. The fourth chip pads 324 may include a conductive material. For example, the fourth chip pads 324 may include copper (Cu).

The second chip lines 326 may be provided in the second dielectric layer 322. Some of the second vias 330 may penetrate the second base layer 310 and may have connection with the second chip lines 326. The second chip lines 326 may electrically connect the fourth chip pads 324 to the some of the second vias 330. Others of the second vias 330 may penetrate the second base layer 310 and the second circuit layer 320, and may connect the third chip pads 314 to the first chip pads 224. The second semiconductor chip 300 may be directly connected through the second vias 330 to the first circuit layer 220, or may be connected through the second vias 330 and the second circuit layer 320 to the first circuit layer 220 of the first semiconductor chip 200.

A direct bonding may be used to bond the second semiconductor chip 300 to the first semiconductor chip 200. For example, an inter-metal hybrid bonding may be made between the fourth chip pads 324 of the second semiconductor chip 300 and the first chip pads 224 of the first semiconductor chip 200. For example, the fourth chip pad 324 and the first chip pad 224 may directly contact each other, may have a continuous configuration and may have an invisible interface therebetween. In some example embodiments, a hybrid bonding may be made between the second dielectric layer 322 of the second semiconductor chip 300 and the first dielectric layer 222 of the first semiconductor chip 200. For example, the second dielectric layer 322 and the first dielectric layer 222 may directly contact each other, may have a continuous configuration, and may have an invisible interface therebetween.

According to some example embodiments of the present inventive concepts, as the second semiconductor chip 300 has the second circuit layer 320, the second semiconductor chip 300 may increase in the degree of wiring freedom.

According to some example embodiments, the second semiconductor chip 300 may further include a second circuit layer 320. As illustrated in FIG. 3, the second semiconductor chip 300 may be flip-chip mounted on the first semiconductor chip 200. For example, second connection terminals 302 may be provided below the second circuit layer 320 of the second semiconductor chip 300. The second connection terminals 302 may be located on the fourth chip pads 324. The second connection terminals 302 may connect the fourth chip pads 324 to the first chip pads 224. The second semiconductor chip 300 may be connected to the first circuit layer 220 of the first semiconductor chip 200 through the second vias 330, the second circuit layer 320, and the second connection terminals 302. The following description will focus on the embodiment of FIG. 1.

Referring back to FIG. 1, the third semiconductor chip 400 may be provided below the first semiconductor chip 200. The third semiconductor chip 400 may be located below the first base layer 210 of the first semiconductor chip 200. For example, the third semiconductor chip 400 may be located on the inactive surface 200b of the first semiconductor chip 200. The third semiconductor chip 400 may have a width less than that of the first semiconductor chip 200. The first semiconductor chip 200 may be provided on its bottom surface with the third semiconductor chip 400 located in the through hole 102 of the substrate 100. For example, the third semiconductor chip 400 may be inserted into the through hole 102. The third semiconductor chip 400 may have a thickness less than that of the substrate 100. Therefore, the third semiconductor chip 400 may have a bottom surface located at a level the same as or higher than that of the bottom surface of the substrate 100. For example, the third semiconductor chip 400 may not protrude outwardly from the bottom surface of the substrate 100. The present inventive concepts, however, are not limited thereto, and under a condition that the third semiconductor chip 400 does not protrude outwardly from the bottom surface of the substrate 100, the thickness of the third semiconductor chip 400 may be the same as or greater than that of the substrate 100. The third semiconductor chip 400 may have a thickness of about 5 μm to about 20 μm.

The third semiconductor chip 400 may include a third base layer 410. The third base layer 410 may include a silicon (Si) substrate. The third base layer 410 may include second photodiodes 412 and a third integrated circuit. For example, the third semiconductor chip 400 may be an image sensing chip.

The second photodiodes 412 and the third integrated circuit may be provided on a lower portion of the third base layer 410. When viewed in a plan view, the second photodiodes 412 may be located below a central portion of the third base layer 410. The second photodiodes 412 may generate electrical signals from light that is incident through a second pixel array which will be discussed below.

The third integrated circuit may include circuits such as transistors, and may also include wiring patterns connected to the circuits. The second integrated circuit may process signals received from the second photodiodes 412.

The third semiconductor chip 400 may include fifth chip pads 414 on the bottom surface thereof, and the bottom surface of the third semiconductor chip 400 may serve as an active surface 400a. The fifth chip pads 414 may be exposed on a bottom surface of the third base layer 410. The fifth chip pads 414 may be electrically connected through the third integrated circuit to the second photodiodes 412.

A second pixel array may be provided on the lower portion of the third semiconductor chip 400. The third base layer 410 may be provided on its bottom surface with the second pixel array that includes second pixels P2 provided on the second photodiodes 412. When viewed in a plan view, the second pixels P2 may be provided on a central portion of the third semiconductor chip 400. The fifth chip pads 414 may be positioned outside the second pixel array.

The third semiconductor chip 400 may be provided on its bottom surface with second color filters 440 and second microlenses 450 provided on corresponding second pixels P2. A single second color filter 440 and a single second microlens 450 may correspond to each of the second pixels P2. The second color filters 440 may include red, green, and blue (RGB) filters. In some example embodiments, the second color filters 440 may include a combination of filters that filters various colors.

The third semiconductor chip 400 may be mounted on the first semiconductor chip 200. For example, the third semiconductor chip 400 may be in contact with the bottom surface of the first semiconductor chip 200. In this case, an inactive surface of the third semiconductor chip 400 may be in contact with the inactive surface 200b of the first semiconductor chip 200. The third semiconductor chip 400 may include third vias 430 that vertically penetrate the third semiconductor chip 400 and the first semiconductor chip 200. For example, the third vias 430 may penetrate the third base layer 410 and may be coupled to the fifth chip pads 414 on the bottom surface (e.g., the active surface 400a) of the third semiconductor chip 400. The third vias 430 may extend into the first semiconductor chip 200 and may penetrate the third base layer 410 and the first base layer 210, thereby being coupled to the first chip pads 224 of the first circuit layer 220 included in the first semiconductor chip 200. The third semiconductor chip 400 may be electrically connected through the third vias 430 to the first semiconductor chip 200.

A direct bonding may be used to bond the third semiconductor chip 400 to the first semiconductor chip 200. For example, a hybrid bonding may be made between the third base layer 410 of the third semiconductor chip 400 and the first base layer 210 of the first semiconductor chip 200. For example, the third base layer 410 and the first base layer 210 may have a continuous configuration and may have an invisible interface therebetween. The first base layer 210 and the third base layer 410 may include, for example, silicon (Si). In some example embodiments, the first base layer 210 and the third base layer 410 may contain nitrogen or oxygen on surfaces thereof. For example, the first base layer 210 and the third base layer 410 may include oxide, nitride, or oxynitride.

Differently from that shown, an adhesion layer may be used to attach the third semiconductor chip 400 to the first semiconductor chip 200. For example, the adhesion layer may be interposed between the first base layer 210 of the first semiconductor chip 200 and the third base layer 410 of the third semiconductor chip 400. In this case, the third vias 430 may penetrate all of the first base layer 210, the third base layer 410, and the adhesion layer, thereby being coupled to the first circuit layer 220.

According to some example embodiments of the present inventive concepts, as a direct bonding is used to bond the first semiconductor chip 200 to the third semiconductor chip 400, the third semiconductor chip 400 may be rigidly coupled onto the first semiconductor chip 200. A semiconductor package may then have improved structural stability. Further, the third vias 430 may be used to directly connect the third semiconductor chip 400 to the active surface 200a of the first semiconductor chip 200, and thus a reduced electrical length may be provided between the first semiconductor chip 200 and the third semiconductor chip 400, which may result in an improvement in electrical properties.

In addition, the second semiconductor chip 300 and the third semiconductor chip 400 may be connected to a single logic chip or a single first semiconductor chip 200. Accordingly, there may be no need for a plurality of logic chips to drive the second semiconductor chip 300 and the third semiconductor chip 400, respectively, and there may be a reduction in the number of chips provided to a semiconductor package. Therefore, it may be possible to provide a compact-sized semiconductor package.

According to some example embodiments, the third semiconductor chip 400 may further include a third circuit layer 420. As illustrated in FIG. 2, the third circuit layer 420 may be provided on the top surface of the third base layer 410, or the inactive surface of the third semiconductor chip 400. The third circuit layer 420 may include a third dielectric layer 422, sixth chip pads 424, and third chip lines 426.

The third dielectric layer 422 may cover the top surface of the third base layer 410. The third dielectric layer 422 may include a dielectric material. For example, the third dielectric layer 422 may include silicon oxide (SiO), silicon nitride (SiN), or silicon oxynitride (SiON).

The sixth chip pads 424 may be provided on an upper portion of the third dielectric layer 422. The sixth chip pads 424 may be exposed by a top surface of the third dielectric layer 422. In this case, the sixth chip pads 424 may have their top surfaces coplanar with that of the third dielectric layer 422. The sixth chip pads 424 may include a conductive material. For example, the sixth chip pads 424 may include copper (Cu).

The third chip lines 426 may be provided in the third dielectric layer 422. Some of the third vias 430 may penetrate the third base layer 410 and may have connection with the third chip lines 426. The third chip lines 426 may electrically connect the sixth chip pads 424 to the some of the third vias 430. Others of the third vias 430 may penetrate the third base layer 410, the third circuit layer 420, and the first base layer 210, and may connect fifth chip pads 414 to the first circuit layer 220. Some of the first vias 230 may penetrate the first base layer 210 and may connect the sixth chip pads 424 to the first chip lines 226. The third semiconductor chip 400 may be directly connected through the third vias 430 to the first circuit layer 220, and may be connected to the first circuit layer 220 of the first semiconductor chip 200 through the third vias 430, the third circuit layer 420, and the first vias 230.

A direct bonding may be used to bond the third semiconductor chip 400 to the first semiconductor chip 200. For example, an inter-metal hybrid bonding may be made between the sixth chip pads 424 of the third semiconductor chip 400 and the first vias 230 of the first semiconductor chip 200. For example, the sixth chip pad 424 and the first via 230 may directly contact each other, may have a continuous configuration, and may have an invisible interface therebetween. In some example embodiments, a hybrid bonding may be made between the third dielectric layer 422 of the third semiconductor chip 400 and the first base layer 210 of the first semiconductor chip 200. For example, the first base layer 210 and the third dielectric layer 422 may have a continuous configuration and may have an invisible interface therebetween. For example, the first base layer 210 may include silicon (Si), and the third dielectric layer 422 may include silicon oxide, silicon nitride, or silicon oxynitride. The first base layer 210 and the third dielectric layer 422 may contact each other, and oxygen or nitrogen may diffuse from the third dielectric layer 422 into the first base layer 210. The third dielectric layer 422 and the first base layer 210 may have a continuous configuration around an interface therebetween.

According to some example embodiments of the present inventive concepts, as the third semiconductor chip 400 has the third circuit layer 420, the third semiconductor chip 400 may increase in the degree of wiring freedom. The following description will focus on the example embodiment of FIG. 1.

Referring again to FIG. 1, a first transparent substrate 510 may be located on the substrate 100. The first transparent substrate 510 may have a plate shape that covers the image sensor structure ISS. The first transparent substrate 510 may be located on the second semiconductor chip 300, and may filter a specific component of incident light that is introduced into the second semiconductor chip 300. For example, the first transparent substrate 510 may be formed of polymer or glass on which is coated an optical material for filtering or improving the sensitivity of light at desired wavelength ranges. For another example, the first transparent substrate 510 may be formed of a transparent member through which incident light passes without being filtered. The first transparent substrate 510 may have a thickness of about 100 μm to about 150 μm. The first transparent substrate 510 may be located apart from the second semiconductor chip 300. For example, the first transparent substrate 510 may be spaced apart from the first microlenses 350. An interval between the first transparent substrate 510 and the first semiconductor chip 200 may be in a range of about 50 μm to about 150 μm. The second semiconductor chip 300 may sense light that is incident through the first transparent substrate 510.

A spacer 550 may be provided between the substrate 100 and the first transparent substrate 510. The spacer 550 may fix the first transparent substrate 510 onto the top surface of the substrate 100. The first transparent substrate 510 may be located at a level from the substrate 100 higher than that of top surfaces of the first microlenses 350, and the level of the first transparent substrate 510 may depend on a height of the spacer 550. For example, the height of the spacer 550 may be greater than a distance between the top surface of the substrate 100 and the top surface (e.g., the active surface 300a) of the second semiconductor chip 300. The spacer 550 may be located on an outer portion of the substrate 100. For example, when viewed in a plan view, the spacer 550 may have an annular shape that surrounds the image sensor structure ISS.

A second transparent substrate 520 may be located below the substrate 100. For example, the second transparent substrate 520 may be inserted into the recess region 104 on a lower portion of the substrate 100. In this case, the second transparent substrate 520 may cover the through hole 102 on the lower portion of the substrate 100. The substrate 100 may be provided therein with a space defined by the second transparent substrate 520, the first semiconductor chip 200, and the through hole 102, and the space may have the third semiconductor chip 400 therein. The second transparent substrate 520 may be located below the third semiconductor chip 400, and may filter a specific component of incident light that is introduced into the third semiconductor chip 400. For example, the second transparent substrate 520 may be formed of polymer or glass on which is coated an optical material for filtering or improving the sensitivity of light at desired wavelength ranges. For another example, the second transparent substrate 520 may be formed of a transparent member through which incident light passes without being filtered. The second transparent substrate 520 may have a thickness of about 100 μm to about 150 μm. The second transparent substrate 520 may be spaced apart from the third semiconductor chip 400. For example, the second transparent substrate 520 may be spaced apart from the second microlenses 450. In this case, the bottom surface of the third semiconductor chip 400 may be located at a level higher than that of a bottom surface of the recess region 104. An interval between the second transparent substrate 520 and the third semiconductor chip 400 may be in a range of about 50 μm to about 150 μm. The third semiconductor chip 400 may sense light that is incident through the second transparent substrate 520.

According to some example embodiments, as the third semiconductor chip 400 and the second transparent substrate 520 are embedded in the substrate 100, a semiconductor package may decrease in thickness and size.

In the example embodiments that follow, a detailed description of technical features repetitive to those discussed above with reference to FIGS. 1 to 3 will be omitted and differences will be discussed in detail. The same reference numerals may be allocated to the same components as those of the semiconductor package according to some example embodiments of the present inventive concepts.

Figure 4:
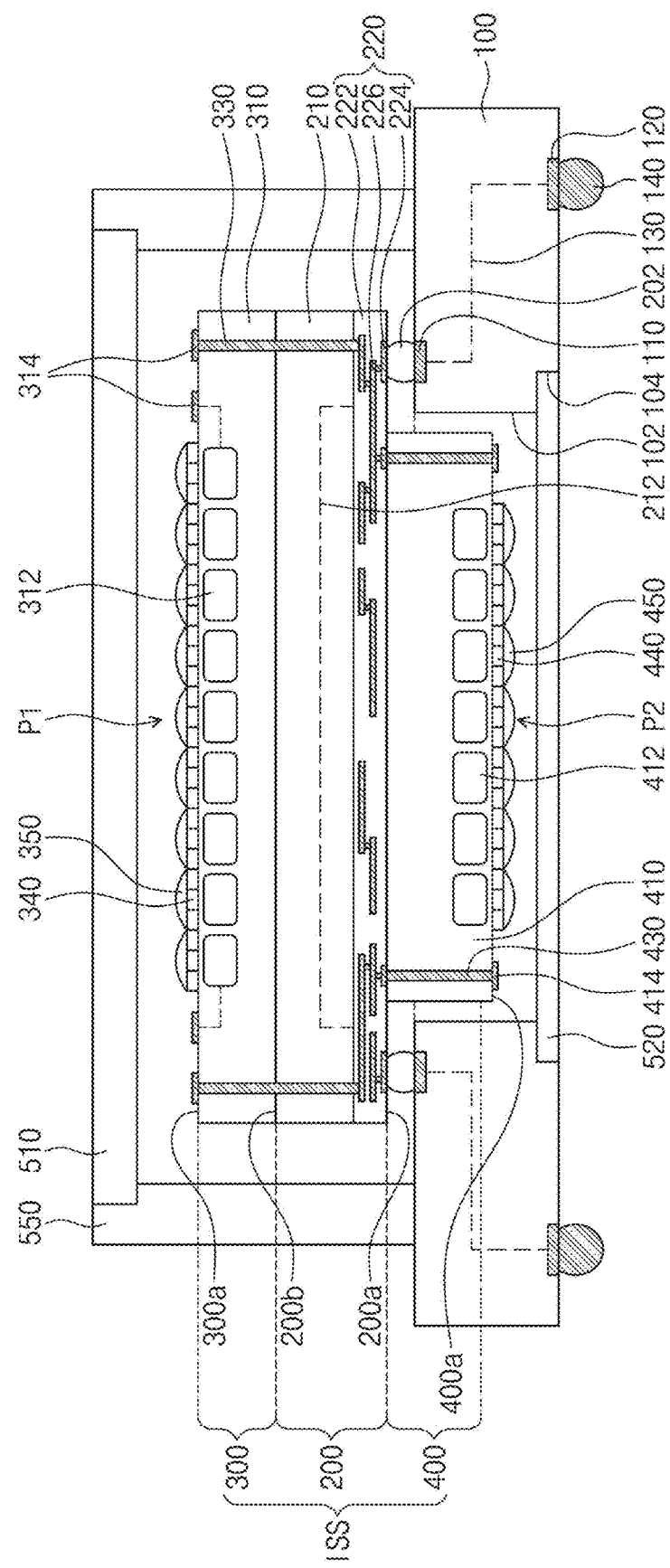
Figure 5:
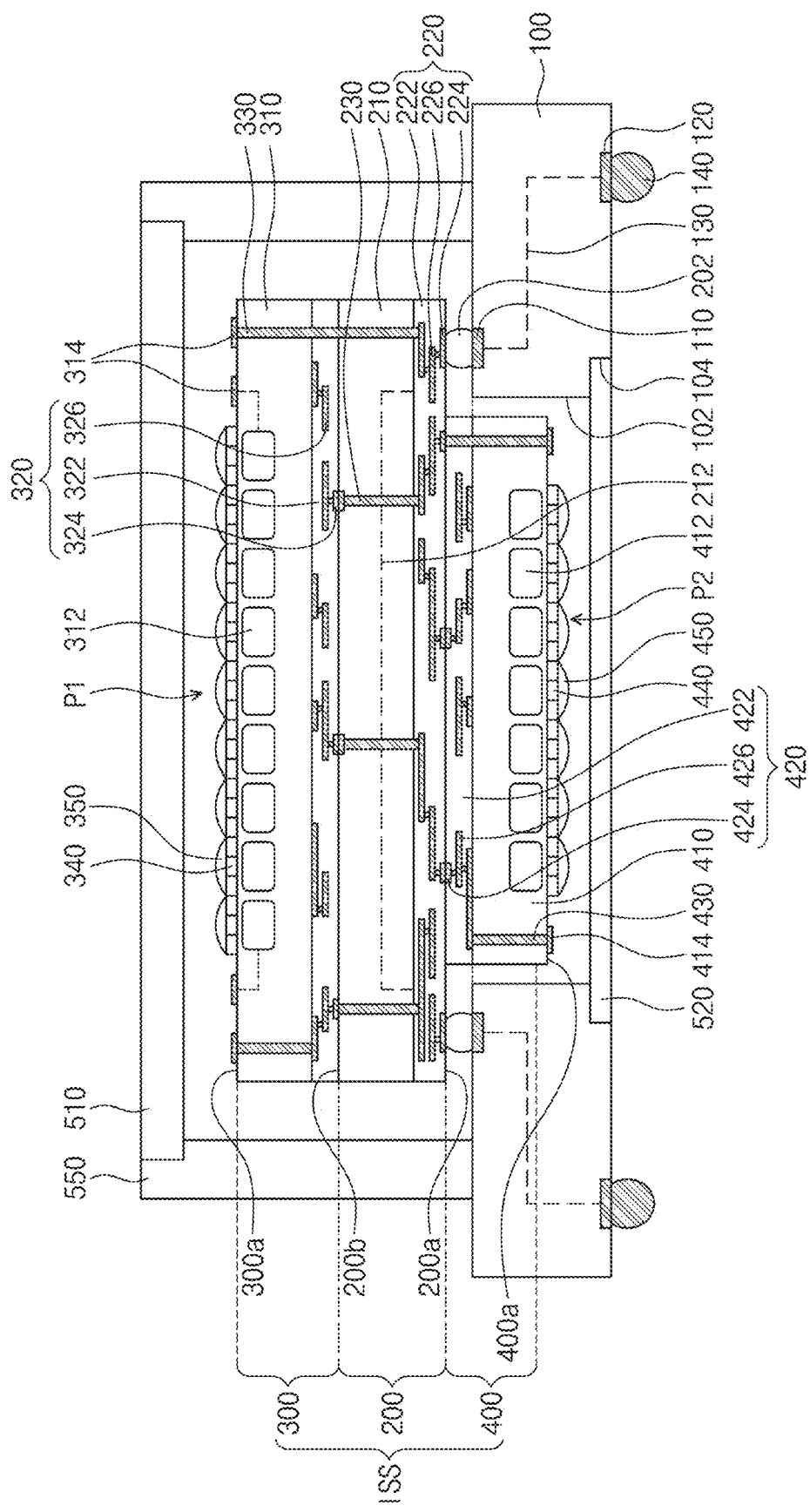

FIGS. 4 and 5 are cross-sectional views illustrating semiconductor packages according to some example embodiments of the present inventive concepts.

Referring to FIG. 4, a first semiconductor chip 200 may be located on a substrate 100. The first semiconductor chip 200 may cover a through hole 102. The first semiconductor chip 200 may include a first base layer 210 and a first circuit layer 220.

A first integrated circuit 212 may be provided on a bottom surface of the first base layer 210. For example, the first semiconductor chip 200 may be located in a face-down state where an active surface 200a of the first semiconductor chip 200 faces the substrate 100. A bottom surface of the first semiconductor chip 200 may be the active surface 200a, and a top surface of the first semiconductor chip 200 may be an inactive surface 200b that is opposite to the bottom surface. The first semiconductor chip 200 may be a logic chip.

The first circuit layer 220 may be provided below the first base layer 210. The first circuit layer 220 may include a first dielectric layer 222, first chip pads 224, and first chip lines 226. The first dielectric layer 222 may cover the bottom surface of the first base layer 210. The first chip pads 224 may be provided on a lower portion of the first dielectric layer 222. The first chip pads 224 may be exposed by a bottom surface of the first dielectric layer 222. The first chip lines 226 may be provided in the first dielectric layer 222. The first chip lines 226 may electrically connect the first chip pads 224 to the first integrated circuit 212 of the first base layer 210.

The first semiconductor chip 200 may be mounted on the substrate 100. For example, the substrate 100 may be provided on its top surface with some of the first chip pads 224 provided on the bottom surface of the first semiconductor chip 200, or the active surface 200a of the first semiconductor chip 200. First connection terminals 202 may be provided between the first substrate pads 110 and the first chip pads 224. The first connection terminals 202 may connect the first substrate pads 110 to the first chip pads 224. The first semiconductor chip 200 may be electrically connected through the first connection terminals 202 to the substrate 100.

A second semiconductor chip 300 may be provided on the first semiconductor chip 200. The second semiconductor chip 300 may be located on the first base layer 210 of the first semiconductor chip 200. For example, the second semiconductor chip 300 may be located on the inactive surface 200b of the first semiconductor chip 200.

The second semiconductor chip 300 may include a second base layer 310. The second base layer 310 may include first photodiodes 312 and a second integrated circuit. For example, the second semiconductor chip 300 may be an image sensing chip. The second semiconductor chip 300 may include third chip pads 314 on a top surface thereof, and the top surface of the second semiconductor chip 300 may serve as an active surface 300*a*. The third chip pads 314 may be electrically connected through the second integrated circuit to the first photodiodes 312.

A first pixel array may be provided on an upper portion of the second semiconductor chip 300. The first pixel array may include first pixels P1 provided on the first photodiodes 312 of the second base layer 310.

The second semiconductor chip 300 may be mounted on the first semiconductor chip 200. For example, the second semiconductor chip 300 may be in contact with the top surface of the first semiconductor chip 200. In this case, the second semiconductor chip 300 may have an inactive surface in contact with the inactive surface 200*b* of the first semiconductor chip 200. The second semiconductor chip 300 may include second vias 330 that vertically penetrate the second semiconductor chip 300 and the first semiconductor chip 200. For example, the second vias 330 may vertically penetrate the second base layer 310 and may be coupled to the third chip pads 314 on the top surface of the second semiconductor chip 300. The second vias 330 may extend into the first semiconductor chip 200 and may penetrate the second base layer 310 and the first base layer 210, thereby being coupled to the first chip pads 224 of the first circuit layer 220 included in the first semiconductor chip 200. The second semiconductor chip 300 may be electrically connected through the second vias 330 to the first semiconductor chip 200.

A direct bonding may be used to bond the second semiconductor chip 300 to the first semiconductor chip 200. For example, a hybrid bonding may be made between the second base layer 310 of the second semiconductor chip 300 and the first base layer 210 of the first semiconductor chip 200. For example, the second base layer 310 and the first base layer 210 may have a continuous configuration and may have an invisible interface therebetween. The first base layer 210 and the second base layer 310 may include, for example, silicon (Si). In some example embodiments, the first base layer 210 and the second base layer 310 may contain nitrogen or oxygen on surfaces thereof.

Differently from that shown, an adhesion layer may be used to attach the second semiconductor chip 300 to the first semiconductor chip 200. For example, the adhesion layer may be interposed between the first base layer 210 of the first semiconductor chip 200 and the second base layer 310 of the second semiconductor chip 300. In this case, the second vias 330 may penetrate all of the first base layer 210, the second base layer 310, and the adhesion layer, thereby being coupled to the first circuit layer 220.

According to some example embodiments, the second semiconductor chip 300 may further include a second circuit layer 320. As illustrated in FIG. 5, the second circuit layer 320 may be provided on a bottom surface of the second base layer 310, or the inactive surface of the second semiconductor chip 300. The second circuit layer 320 may include a second dielectric layer 322, fourth chip pads 324, and second chip lines 326.

A direct bonding may be used to bond the second semiconductor chip 300 to the first semiconductor chip 200. For example, an inter-metal hybrid bonding may be made between the fourth chip pads 324 of the second semiconductor chip 300 and the first vias 230 of the first semiconductor chip 200. For example, the fourth chip pad 324 and the first via 230 may directly contact each other, may have a continuous configuration, and may have an invisible interface therebetween. In some example embodiments, a hybrid bonding may be made between the second dielectric layer 322 of the second semiconductor chip 300 and the first base layer 210 of the first semiconductor chip 200. For example, the first base layer 210 and the second dielectric layer 322 may have a continuous configuration and may have an invisible interface therebetween. The following description will focus on the embodiment of FIG. 4.

Referring back to FIG. 4, a third semiconductor chip 400 may be provided below the first semiconductor chip 200. The third semiconductor chip 400 may be located on the first circuit layer 220 of the first semiconductor chip 200. For example, the third semiconductor chip 400 may be located on the active surface 200*a* of the first semiconductor chip 200.

The third semiconductor chip 400 may include a third base layer 410. The third base layer 410 may include second photodiodes 412 and a third integrated circuit. For example, the third semiconductor chip 400 may be an image sensing chip. The third semiconductor chip 400 may include fifth chip pads 414 on a bottom surface thereof, and the bottom surface of the third semiconductor chip 400 may serve as an active surface 400*a*. The fifth chip pads 414 may be electrically connected through the third integrated circuit to the second photodiodes 412.

A second pixel array may be provided on a lower portion of the third semiconductor chip 400. The second pixel array may include second pixels P2 provided on the second photodiodes 412 of the third base layer 410.

The third semiconductor chip 400 may be mounted on the first semiconductor chip 200. For example, the third semiconductor chip 400 may be in contact with the bottom surface of the first semiconductor chip 200. In this case, the third semiconductor chip 400 may have an inactive surface in contact with the active surface 200*a* of the first semiconductor chip 200. The third semiconductor chip 400 may have third vias 430 that vertically penetrate the third semiconductor chip 400. For example, the third vias 430 may vertically penetrate the third base layer 410 and may be coupled to the fifth chip pads 414 on the bottom surface (e.g., the active surface 400*a*) of the third semiconductor chip 400. The third vias 430 may extend toward a top surface of the third base layer 410 and may penetrate the third base layer 410, thereby being coupled to the first chip pads 224 of the first circuit layer 220 included in the first semiconductor chip 200. The third semiconductor chip 400 may be electrically connected through the third vias 430 to the first semiconductor chip 200.

A direct bonding may be used to bond the third semiconductor chip 400 to the first semiconductor chip 200. For example, a hybrid bonding may be made between the third base layer 410 of the third semiconductor chip 400 and the first dielectric layer 222 of the first circuit layer 220 included in the first semiconductor chip 200. For example, the third base layer 410 and the first dielectric layer 222 may have a continuous configuration and may have an invisible interface therebetween. For example, the third base layer 410 may include silicon (Si), and the first dielectric layer 222 may include silicon oxide, silicon nitride, or silicon oxynitride. In some example embodiments, the third base layer 410 may include a passivation layer on the top surface thereof, and the passivation layer and the first dielectric layer 222 may include the same material and may have a continuous configuration.

Differently from that shown, an adhesion layer may be used to attach the third semiconductor chip 400 to the first semiconductor chip 200. For example, the adhesion layer may be interposed between the first circuit layer 220 of the first semiconductor chip 200 and the third base layer 410 of the third semiconductor chip 400. In this case, the third vias 430 may penetrate all of the third base layer 410 and the adhesion layer.

According to some example embodiments, the third semiconductor chip 400 may further include a third circuit layer 420. As illustrated in FIG. 5, the third circuit layer 420 may be provided on the top surface of the third base layer 410, or the inactive surface of the third semiconductor chip 400. The third circuit layer 420 may include a third dielectric layer 422, sixth chip pads 424, and third chip lines 426.

A direct bonding may be used to bond the third semiconductor chip 400 to the first semiconductor chip 200. For example, an inter-metal hybrid bonding may be made between the sixth chip pads 424 of the third semiconductor chip 400 and the first chip pads 224 of the first semiconductor chip 200. For example, the sixth chip pad 424 and the first chip pad 224 may directly contact each other, may have a continuous configuration, and may have an invisible interface therebetween. For another example, a hybrid bonding may be made between the second dielectric layer 322 of the second semiconductor chip 300 and the first dielectric layer 222 of the first semiconductor chip 200. For example, the first dielectric layer 222 and the second dielectric layer 322 may have a continuous configuration and may have an invisible interface therebetween.

Figure 6:
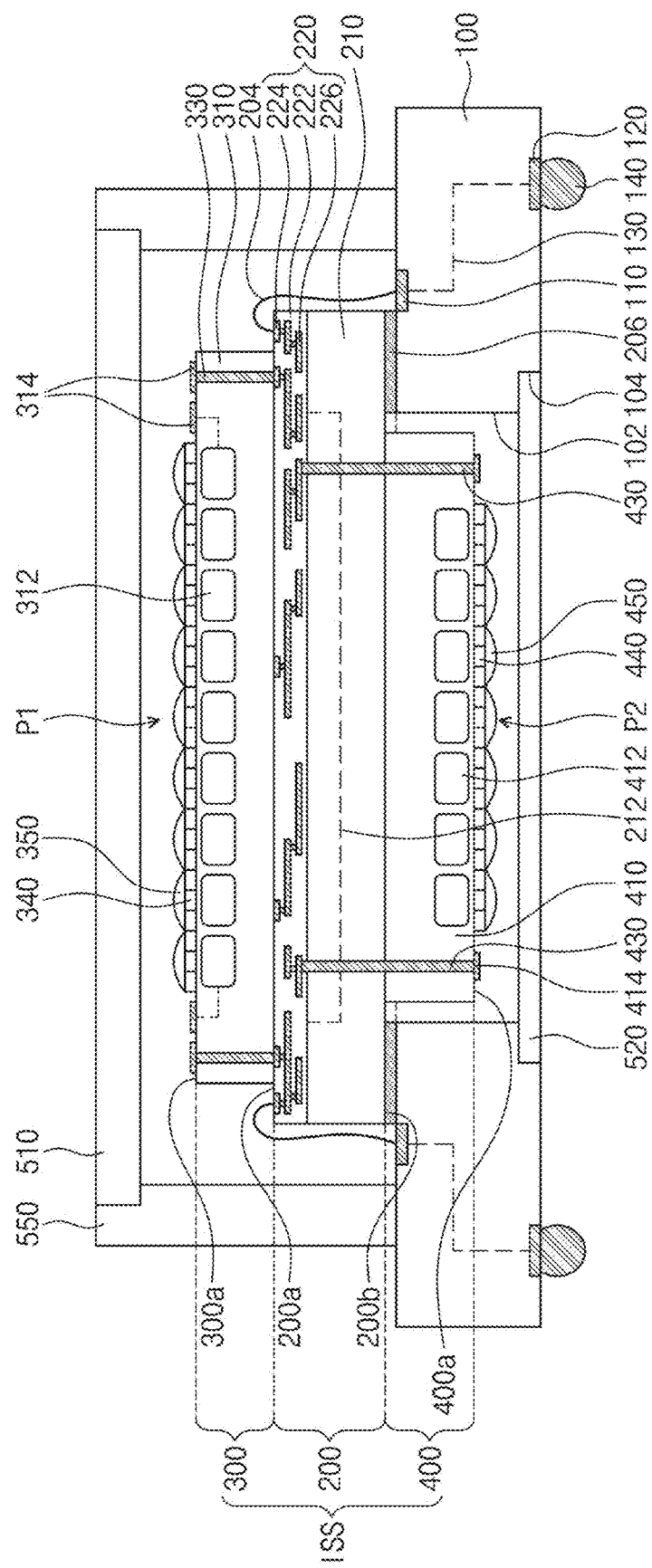
Figure 7:
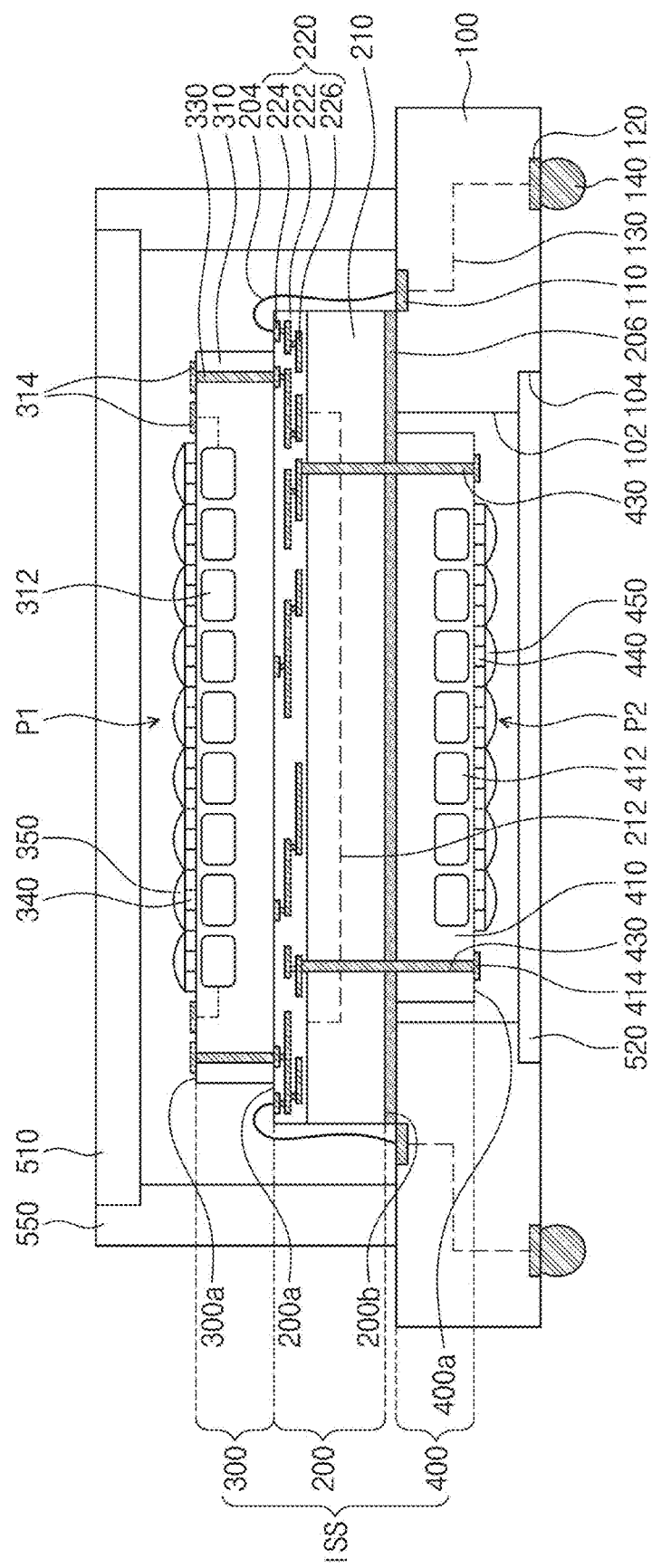

FIGS. 6 and 7 are cross-sectional views illustrating semiconductor packages according to some example embodiments of the present inventive concepts.

Referring to FIG. 6, a first semiconductor chip 200 may be located on a substrate 100. The first semiconductor chip 200 may cover a through hole 102. The first semiconductor chip 200 may include a first base layer 210 and a first circuit layer 220.

A first integrated circuit 212 may be provided on a top surface of the first base layer 210. For example, the first semiconductor chip 200 may be disposed in a face-up state. A top surface of the first semiconductor chip 200 may be an active surface 200a, and a bottom surface of the first semiconductor chip 200 may be an inactive surface 200b opposite to the top surface. The first semiconductor chip 200 may be a logic chip.

The first circuit layer 220 may be provided on the first base layer 210. The first circuit layer 220 may include a first dielectric layer 222, first chip pads 224, and first chip lines 226. The first dielectric layer 222 may cover a top surface of the first base layer 210. The first chip pads 224 may be provided on an upper portion of the first dielectric layer 222. The first chip pads 224 may be exposed by a top surface of the first dielectric layer 222. The first chip lines 226 may be provided in the first dielectric layer 222. The first dielectric layer 222 may electrically connect the first chip pads 224 to the first integrated circuit 212 of the first base layer 210.

The first semiconductor chip 200 may be attached to the substrate 100. For example, an adhesion layer 206 may be interposed between a top surface of the substrate 100 and the bottom surface (e.g., the inactive surface 200b) of the first semiconductor chip 200. The through hole 102 may penetrate the adhesion layer 206 to expose the bottom surface of the first semiconductor chip 200. For example, when viewed in a plan view, the adhesion layer 206 may have an annular shape that surrounds the through hole 102. The adhesion layer 206 may attach the first semiconductor chip 200 to the substrate 100.

The first semiconductor chip 200 may be mounted on the substrate 100. For example, the first semiconductor chip 200 may be provided on its side with connection wires 204 that extend from the top surface of the first semiconductor chip 200 to the top surface of the substrate 100. For example, the connection wires 204 may connect first substrate pads 110 of the substrate 100 to some of the first chip pads 224 included in the first semiconductor chip 200. The first substrate pads 110 may be located on the side of the first semiconductor chip 200, and the some of the first chip pads 224 may be located on an outer portion of the first semiconductor chip 200.

Differently from that shown, as illustrated in FIG. 7, the adhesion layer 206 may cover an entire bottom surface of the first semiconductor chip 200. For example, an adhesion layer 206 may be interposed between the first semiconductor chip 200 and the substrate 100 and between the first semiconductor chip 200 and a third semiconductor chip 400. In this case, the adhesion layer 206 may be used to attach the third semiconductor chip 400 to the bottom surface of the first semiconductor chip 200, and the third vias 430 may penetrate the third base layer 410, the adhesion layer 206, and the first base layer 210 to have connection with the first circuit layer 220 of the first semiconductor chip 200. The third semiconductor chip 400 may have a top surface at the same level as that of a top surface of the substrate 100, and may have a thickness less than that of the substrate 100. The following description will focus on the example embodiment of FIG. 6.

A second semiconductor chip 300 may be provided on the first semiconductor chip 200. The second semiconductor chip 300 may be located on the first circuit layer 220 of the first semiconductor chip 200. For example, the second semiconductor chip 300 may be located on the active surface 200a of the first semiconductor chip 200. The second semiconductor chip 300 may have a width less than that of the first semiconductor chip 200. In this case, an outer portion of the first semiconductor chip 200 may be exposed without being covered with the second semiconductor chip 300. The first chip pads 224 may be exposed and coupled to connection wires 204.

Figure 8:
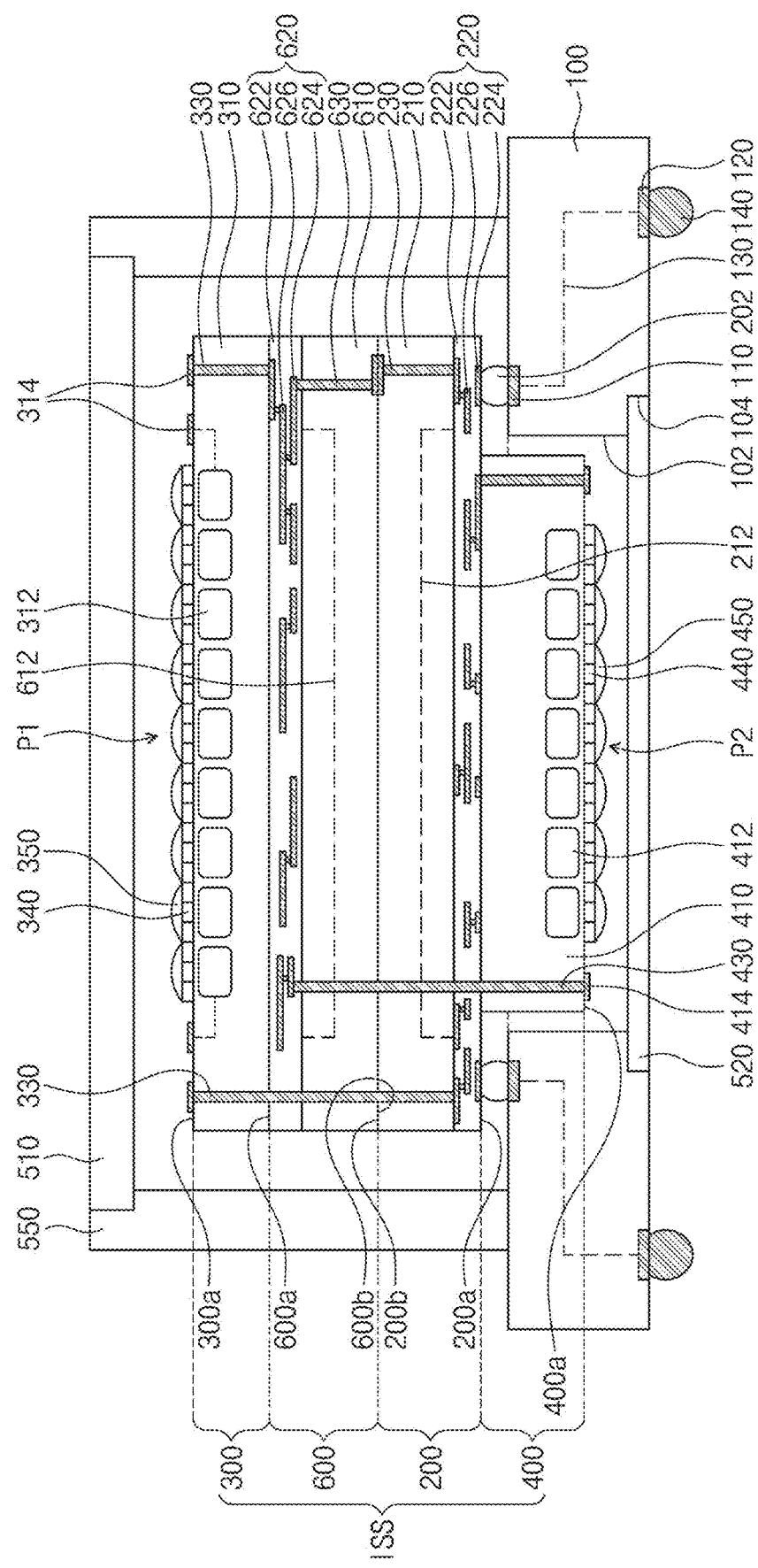
Figure 9:
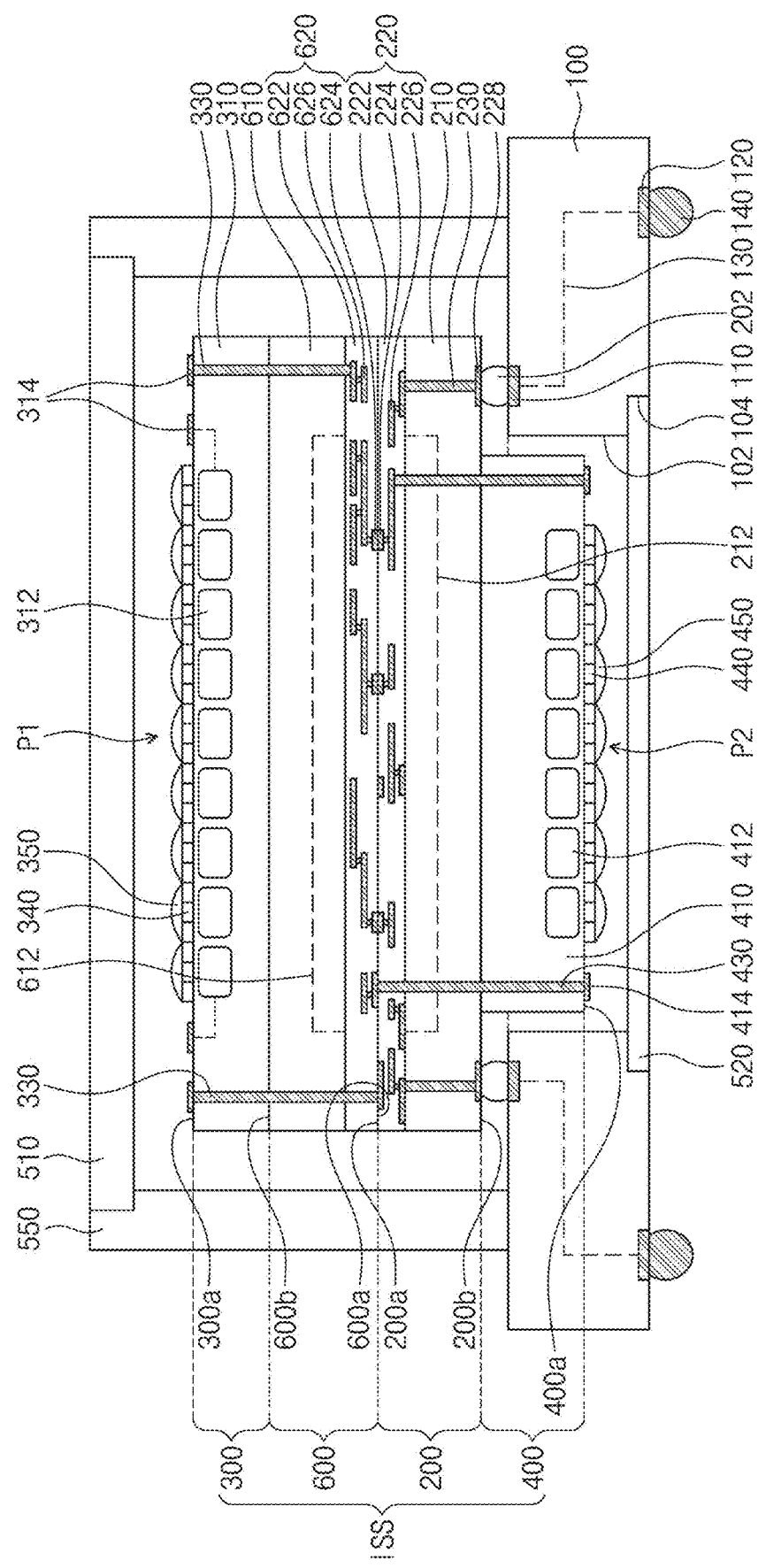
Figure 10:
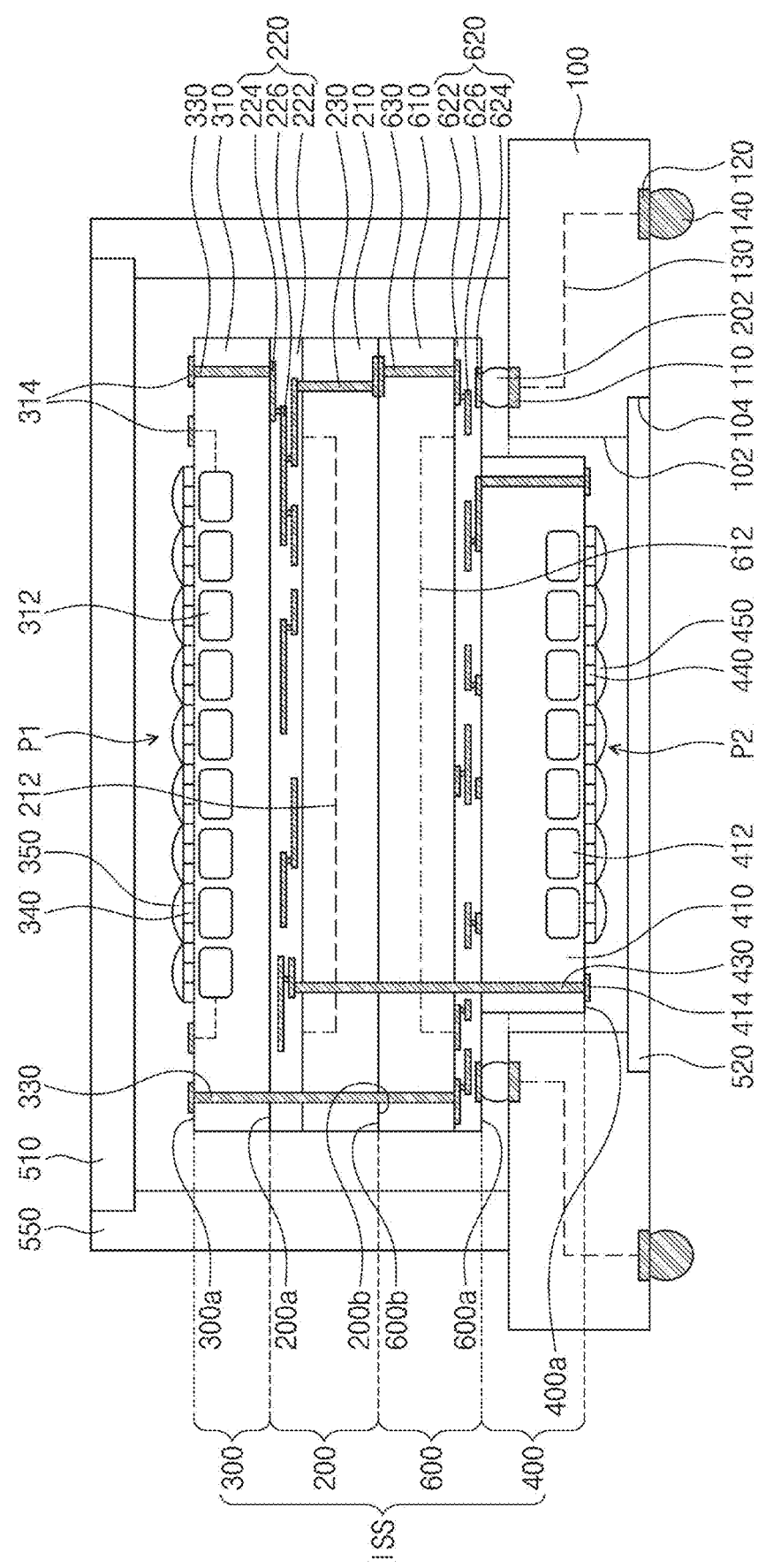

FIGS. 8 to 10 are cross-sectional views illustrating semiconductor packages according to some example embodiments of the present inventive concepts.

Referring to FIG. 8, a first semiconductor chip 200 may be located on a substrate 100. The first semiconductor chip 200 may cover a through hole 102. The first semiconductor chip 200 may include a first base layer 210 and a first circuit layer 220.

A first integrated circuit 212 may be provided on a bottom surface of the first base layer 210. For example, the first semiconductor chip 200 may be disposed in a face-up state. A bottom surface of the first semiconductor chip 200 may be an active surface 200a, and a top surface of the first semiconductor chip 200 may be an inactive surface 200b that is opposite to the bottom surface. The first semiconductor chip 200 may be a logic chip.

A second semiconductor chip 300 may be provided on the first semiconductor chip 200. The second semiconductor chip 300 may be located on the first base layer 210 of the first semiconductor chip 200. For example, the second semiconductor chip 300 may be located on the inactive surface 200b of the first semiconductor chip 200.

A fourth semiconductor chip 600 may further be provided between the first semiconductor chip 200 and the second semiconductor chip 300. The fourth semiconductor chip 600 may include a fourth base layer 610 and a fourth circuit layer 620.

The fourth base layer 610 may include a silicon (Si) substrate. The fourth base layer 610 may include a fourth integrated circuit 612, for example circuits such as transistors, and may also include wiring patterns connected to the circuits. The fourth integrated circuit 612 may be provided on a top surface of the fourth base layer 610. For example, the fourth semiconductor chip 600 may be disposed in a face-up state where an active surface 600a of the fourth semiconductor chip 600 is directed away from the substrate 100. A top surface of the fourth semiconductor chip 600 may be the active surface 600a, and a bottom surface of the fourth semiconductor chip 600 may be an inactive surface 600b that is opposite to the top surface. In this description below, the reference numeral 600a may indicate an active surface of the sixth semiconductor chip 600, and the reference numeral 600b may indicate an inactive surface of the sixth semiconductor chip 600. The active and inactive surfaces 600a and 600b may change positions with each other. The fourth integrated circuit 612 may include a memory circuit. For example, the fourth semiconductor chip 600 may be a memory chip.

The fourth circuit layer 620 may be provided on the first base layer 210. The fourth circuit layer 620 may include a fourth dielectric layer 622, seventh chip pads 624, and fourth chip lines 626. The fourth dielectric layer 622 may cover a top surface of the fourth base layer 610. The seventh chip pads 624 may be provided on an upper portion of the fourth dielectric layer 622. The seventh chip pads 624 may be exposed by a top surface of the fourth dielectric layer 622. The fourth chip lines 626 may be provided in the fourth dielectric layer 622. The fourth dielectric layer 622 may electrically connect the seventh chip pads 624 to the fourth integrated circuit 612 of the fourth base layer 610.

The fourth semiconductor chip 600 may be located on the first semiconductor chip 200. For example, the fourth semiconductor chip 600 may be in contact with the top surface of the first semiconductor chip 200. For example, the inactive surface 600b of the fourth semiconductor chip 600 may be in contact with the inactive surface 200b of the first semiconductor chip 200. The first semiconductor chip 200 may have first vias 230 that penetrate the first base layer 210 and have connection with the first circuit layer 220, and the fourth semiconductor chip 600 may have fourth vias 630 that penetrate the fourth base layer 610 and have connection with the fourth circuit layer 620. The first via 230 and the fourth via 630 may be connected to each other at a contact surface between the first semiconductor chip 200 and the fourth semiconductor chip 600. In some example embodiments, although not shown, fifth vias may vertically penetrate the first base layer 210 and the fourth base layer 610, and the first circuit layer 220 may be electrically connected through the fifth vias to the fourth circuit layer 620.

The second semiconductor chip 300 may be provided on the fourth semiconductor chip 600. The second semiconductor chip 300 may be located on the fourth circuit layer 620 of the fourth semiconductor chip 600. For example, the second semiconductor chip 300 may be located on the active surface 600a of the fourth semiconductor chip 600.

The second semiconductor chip 300 may be connected to the first semiconductor chip 200 and the fourth semiconductor chip 600. For example, the second semiconductor chip 300 may have an inactive surface in contact with the active surface 600a of the fourth semiconductor chip 600. The second semiconductor chip 300 may have second vias 330 that penetrate the second base layer 310 and have connection with the fourth circuit layer 620. One or more of the second vias 330 may penetrate the second base layer 310 and may be coupled to the fourth circuit layer 620 of the fourth semiconductor chip 600. Another or more of the second vias 330 may penetrate the second base layer 310, the fourth semiconductor chip 600, and the first base layer 210, thereby being coupled to the first circuit layer 220 of the first semiconductor chip 200. The second semiconductor chip 300 may be electrically connected through the second vias 330 to the first semiconductor chip 200 and the fourth semiconductor chip 600.

A third semiconductor chip 400 may be located below the first semiconductor chip 200. The third semiconductor chip 400 may be placed on the first circuit layer 220 of the first semiconductor chip 200. For example, the third semiconductor chip 400 may be disposed on the active surface 200a of the first semiconductor chip 200.

The third semiconductor chip 400 may be connected to the first semiconductor chip 200 and the fourth semiconductor chip 600. For example, the third semiconductor chip 400 may have an inactive surface in contact with the active surface 200a of the first semiconductor chip 200. The third semiconductor chip 400 may have third vias 430 that penetrate a third base layer 410 and have connection with the first circuit layer 220. One or more of the third vias 430 may penetrate the third base layer 410 and may be coupled to the first circuit layer 220 of the first semiconductor chip 200. Another or more of the third vias 430 may penetrate the third base layer 410, the first semiconductor chip 200, and the fourth base layer 610, thereby being coupled to the fourth circuit layer 620 of the fourth semiconductor chip 600. The third semiconductor chip 400 may be electrically connected through the third vias 430 to the first semiconductor chip 200 and the fourth semiconductor chip 600.

According to some example embodiments of the present inventive concepts, the second semiconductor chip 300 and the third semiconductor chip 400 are image sensing chips and may not be respectively connected to and driven by a plurality of logic chips and a plurality of memory chips, but may be connected to and driven by a single first semiconductor chip 200 as a logic chip and a single fourth semiconductor chip 600 as a memory chip. Thus, there may be a reduction in the number of chips desired for driving a plurality of sensing chips, and there may be provided a compact-sized semiconductor package.

FIG. 8 depicts that the first semiconductor chip 200 is provided in a face-down state and the fourth semiconductor chip 600 is provided in a face-up state, but the present inventive concepts are not limited thereto. As illustrated in FIG. 9, the first semiconductor chip 200 may be provided in a face-up state, and the fourth semiconductor chip 600 may be provided in a face-down state. For example, the active surface 200a of the first semiconductor chip 200 may be in contact with the active surface 600a of the fourth semiconductor chip 600. The first chip pad 224 of the first semiconductor chip 200 may be in contact with the seventh chip pad 624 of the fourth semiconductor chip 600, and the first semiconductor chip 200 and the fourth semiconductor chip 600 may be connected to each other through the first chip pad 224 and the seventh chip pad 624.

The second semiconductor chip 300 may be connected to the first semiconductor chip 200 and the fourth semiconductor chip 600. For example, the inactive surface of the second semiconductor chip 300 may be in contact with the inactive surface 600b of the fourth semiconductor chip 600. The second semiconductor chip 300 may have second vias 330 that penetrate the second base layer 310 and have connection with the second circuit layer 620. One or more of the second vias 330 may penetrate the second base layer 310 and the fourth base layer 610, and may be coupled to the fourth circuit layer 620 of the fourth semiconductor chip 600. Another or more of the second vias 330 may penetrate the second base layer 310 and the fourth semiconductor chip 600, and may be coupled to the first circuit layer 220 of the first semiconductor chip 200. The second semiconductor chip 300 may be electrically connected through the second vias 330 to the first semiconductor chip 200 and the fourth semiconductor chip 600.

The third semiconductor chip 400 may be connected to the first semiconductor chip 200 and the fourth semiconductor chip 600. For example, the inactive surface of the third semiconductor chip 400 may be in contact with the inactive surface 200b of the first semiconductor chip 200. The third semiconductor chip 400 may have third vias 430 that penetrate the third base layer 410 and have connection with the third circuit layer 420. One or more of the third vias 430 may penetrate the third base layer 410 and the first base layer 210, and may be coupled to the first circuit layer 220 of the first semiconductor chip 200. Another or more of the third vias 430 may penetrate the third base layer 410 and the first semiconductor chip 200, and may be coupled to the fourth circuit layer 620 of the fourth semiconductor chip 600. The third semiconductor chip 400 may be electrically connected through the third vias 430 to the first semiconductor chip 200 and the fourth semiconductor chip 600.

According to some example embodiments, a fourth semiconductor chip 600 may be provided between the first semiconductor chip 200 and the third semiconductor chip 400. As illustrated in FIG. 10, the fourth semiconductor chip 600 may be located on the substrate 100. The fourth semiconductor chip 600 may cover the through hole 102. The fourth semiconductor chip 600 may include a fourth base layer 610 and a fourth circuit layer 620.

A fourth integrated circuit 612 may be provided on a bottom surface of the fourth base layer 610. For example, the fourth semiconductor chip 600 may be disposed in a face-down state. A bottom surface of the fourth semiconductor chip 600 may be an active surface 600a, and a top surface of the fourth semiconductor chip 600 may be an inactive surface 600b that is opposite to the bottom surface. The fourth semiconductor chip 600 may be a memory chip.

The fourth circuit layer 620 may be provided below the fourth base layer 610. The fourth circuit layer 620 may include a fourth dielectric layer 622, seventh chip pads 624, and fourth chip lines 626. The fourth dielectric layer 622 may cover a bottom surface of the fourth base layer 610. The seventh chip pads 624 may be exposed by a bottom surface of the fourth dielectric layer 622. In the fourth dielectric layer 622, the fourth chip lines 626 may electrically connect the seventh chip pads 624 to the fourth integrated circuit 612 of the fourth base layer 610.

The fourth semiconductor chip 600 may be mounted on the substrate 100. For example, the substrate 100 may be provided on its top surface with one or more of the seventh chip pads 624 provided on the active surface 600a of the fourth semiconductor chip 600. First connection terminals 202 may connect the first substrate pads 110 to the seventh chip pads 624. The fourth semiconductor chip 600 may be electrically connected through the first connection terminals 202 to the substrate 100.

The fourth semiconductor chip 600 may be located on the first semiconductor chip 200. The first semiconductor chip 200 may be disposed in a face-up state. For example, the inactive surface 200b of the first semiconductor chip 200 may be in contact with the inactive surface 600b of the fourth semiconductor chip 600. The first via 230 of the first semiconductor chip 200 may be connected to the fourth via 630 of the fourth semiconductor chip 600, and the first semiconductor chip 200 and the fourth semiconductor chip 600 may be connected to each other through the first via 230 and the fourth via 630. In some example embodiments, although not shown, the first circuit layer 220 and the fourth circuit layer 620 may be electrically connected to each other through fifth vias that vertically penetrate the first base layer 210 and the fourth base layer 610.

The second semiconductor chip 300 may be connected to the first semiconductor chip 200 and the fourth semiconductor chip 600. For example, the inactive surface of the second semiconductor chip 300 may be in contact with the active surface 200a of the first semiconductor chip 200. The second semiconductor chip 300 may have second vias 330 that penetrate the second base layer 310 and have connection with the second circuit layer 320. One or more of the second vias 330 may penetrate the second base layer 310 and may be coupled to the first circuit layer 220 of the first semiconductor chip 200. Another or more of the second vias 330 may penetrate the second base layer 310, the first semiconductor chip 200, and the fourth base layer 610, thereby being coupled to the fourth circuit layer 620 of the fourth semiconductor chip 600. The second semiconductor chip 300 may be electrically connected through the second vias 330 to the first semiconductor chip 200 and the fourth semiconductor chip 600.

The third semiconductor chip 400 may be connected to the first semiconductor chip 200 and the fourth semiconductor chip 600. For example, the inactive surface of the third semiconductor chip 400 may be in contact with the active surface 600a of the fourth semiconductor chip 600. The third semiconductor chip 400 may have third vias 430 that penetrate the third base layer 410 and have connection with the third circuit layer 420. One or more of the third vias 430 may penetrate the third base layer 410 and may be coupled to the fourth circuit layer 620 of the fourth semiconductor chip 600. Another or more of the third vias 430 may penetrate the third base layer 410, the fourth semiconductor chip 600, and the first base layer 210, thereby being coupled to the first circuit layer 220 of the first semiconductor chip 200. The third semiconductor chip 400 may be electrically connected through the third vias 430 to the first semiconductor chip 200 and the fourth semiconductor chip 600.

Figure 11:
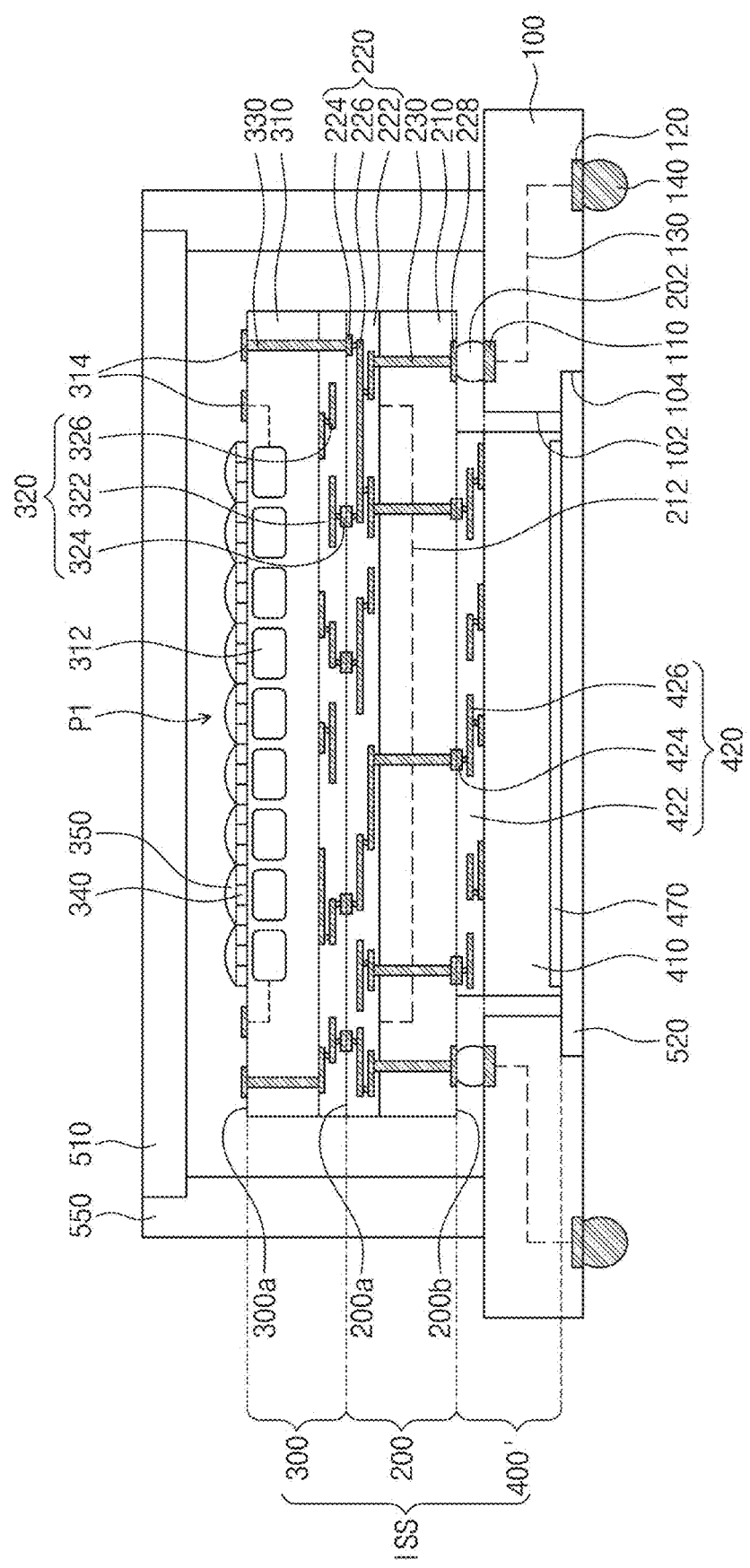

FIG. 11 is a cross-sectional view illustrating semiconductor packages according to some example embodiments of the present inventive concepts.

Referring to FIG. 11, a third semiconductor chip 400' may include a semiconductor chip different from an image sensing chip. For example, the third semiconductor chip 400' may be a semiconductor chip including a display device.

The third semiconductor chip 400' may include a third base layer 410. The third base layer 410 may have a display region 470. For example, the display region 470 may be an area where display devices are formed and light is generated from the display devices. The display device may include a laser device, a light emitting display (LED) device, a liquid crystal display (LCD) device, or any other suitable display device. The display region 470 may be provided on a bottom surface of the third base layer 410. Thus, light generated from the third semiconductor chip 400' may travel in a downward direction away from the third semiconductor chip 400'. For example, the light generated from the third semiconductor chip 400' may be irradiated on the second transparent substrate 520 or may be externally discharged through the second transparent substrate 520.

The third semiconductor chip 400' may include a third circuit layer 420. The third circuit layer 420 may be provided on a top surface of the third base layer 410, or an inactive surface of the third semiconductor chip 400'. The third circuit layer 420 may include a third dielectric layer 422, sixth chip pads 424, and third chip lines 426. The third circuit layer 420 may be electrically connected to the display devices on the display region 470 of the third base layer 410.

The second transparent substrate 520 may be located below the third semiconductor chip 400', and may filter a specific component of light generated from the third semiconductor chip 400'. In some example embodiments, the second transparent substrate 520 may be a transparent member through which the light passes without being filtered. The second transparent substrate 520 may be disposed in contact with or spaced apart from a bottom surface of the third semiconductor chip 400'. In some example embodiments, the second transparent substrate 520 may not be provided as needed.

According to some example embodiments of the present inventive concepts, a semiconductor package may be configured such that second and third semiconductor chips are rigidly coupled to a first semiconductor chip, and thus may improve structural stability.

Moreover, as the second and third semiconductor chips are directly connected to an active surface of the first semiconductor chip, a reduce electrical length may be provided between the first semiconductor chip and the second and third semiconductor chips, which may result in an improvement in electrical properties.

Furthermore, there may be no need for a plurality of logic chips that drive the second and third semiconductor chips, and thus there may be a reduction in the number of chips provided to the semiconductor package. Therefore, the semiconductor package may become small in size.

According to some example embodiments of the present inventive concepts, a third semiconductor chip and a second transparent substrate are embedded in a substrate, and thus the semiconductor package may decrease in thickness and size.

Although the present inventive concepts have been described in connection with some example embodiments of the present inventive concepts illustrated in the accompanying drawings, it will be understood by one of ordinary skill in the art that variations in form and detail may be made therein without departing from the spirit and essential feature of the present inventive concepts. The above disclosed example embodiments should thus be considered illustrative and not restrictive.

What is claimed is:

1. A semiconductor package, comprising:
a substrate including a through hole;
an image sensor structure on the substrate; and
a first transparent substrate on the substrate and spaced apart from the image sensor structure, the image sensor structure being vertically between the first transparent substrate and the substrate,
wherein the image sensor structure includes,
a logic chip on the substrate,
a first sensing chip on a first surface of the logic chip, the first surface including an integrated circuit thereon, and
a second sensing chip on a second surface of the logic chip, the second surface of the logic chip being opposite to the first surface of the logic chip, the second sensing chip connected to the first surface of the logic chip through a first via that vertically penetrates the logic chip,
wherein, on the second surface of the logic chip, one of the first sensing chip or the second sensing chip is in the through hole,
wherein the logic chip is directly connected to the substrate through a connection terminal, and
wherein the first surface of the logic chip faces the substrate, and
the first sensing chip is in the through hole of the substrate.

2. The semiconductor package of claim 1, wherein
the connection terminal is on the second surface of the logic chip, and
the logic chip is mounted on the substrate through the connection terminal.

3. The semiconductor package of claim 2, wherein
the connection terminal is between the substrate and the logic chip, and
when viewed in a plan view, the logic chip is outside the through hole.

4. The semiconductor package of claim 1, wherein
the first sensing chip and the logic chip are bonded each other in direct bonding manner,
a dielectric pattern of the first sensing chip and a dielectric pattern of the logic chip are in contact with each other to constitute a single body, or
a pad of the first sensing chip and a pad of the logic chip are in contact with each other to constitute a single body.

5. The semiconductor package of claim 1, wherein the first sensing chip and the logic chip are connected to each other through a connection terminal between the first sensing chip and the logic chip.

6. The semiconductor package of claim 1, wherein
the substrate has a recess region that extends into the substrate from a bottom surface of the substrate, a width of the recess region being greater than a width of the through hole,
the through hole of the substrate penetrates a central portion of the recess region, and
a second transparent substrate is provided in the recess region.

7. The semiconductor package of claim 1, wherein the first transparent substrate is spaced apart from the image sensor structure by a spacer between the first transparent substrate and the substrate.

8. The semiconductor package of claim 1, wherein
the image sensor structure further includes a memory chip between the logic chip and the second sensing chip,
the first via penetrates the memory chip and the logic chip from the second sensing chip and connected to the first surface of the logic chip, and
the first sensing chip is connected to the memory chip through a second via that vertically penetrates the first sensing chip and the logic chip.

9. The semiconductor package of claim 1, wherein
the image sensor structure further includes a memory chip between the logic chip and the first sensing chip, and
the second sensing chip is connected to the memory chip through a second via that vertically penetrates the second sensing chip and the logic chip.

10. A semiconductor package, comprising:
a substrate having a through hole and a recess region, the through hole penetrating the substrate, the recess region being on a lower portion of the substrate;
a logic chip on the substrate and covering the through hole;
a first sensing chip on the logic chip;
a second sensing chip below the logic chip and being entirely within the through hole, when viewed in a plan view;
a first transparent substrate on the substrate;
a spacer between the substrate and the first transparent substrate, the spacer separating the first transparent substrate and the first sensing chip from each other; and
a second transparent substrate in the recess region of the substrate,
wherein one of the first sensing chip or the second sensing chip is connected to a first surface of the logic chip through a first via that vertically penetrates the logic chip, the first surface including an integrated circuit thereon,
wherein the second sensing chip has a width less than a width of the logic chip, the second sensing chip is entirely within the through hole when viewed in a plan view, and
wherein the other of the first sensing chip and the second sensing chip is on the first surface of the logic chip.

11. The semiconductor package of claim 10, wherein
the first surface of the logic chip faces the first transparent substrate, and
the second sensing chip is connected to the first surface of the logic chip by the first via.

12. The semiconductor package of claim 10, wherein
the first surface of the logic chip faces the second transparent substrate, and
the first sensing chip is connected to the first surface of the logic chip by the first via.

13. The semiconductor package of claim 10, wherein
a connection terminal is between the substrate and the logic chip and outside the through hole, and
the logic chip is mounted on the substrate through the connection terminal.

14. The semiconductor package of claim 10, wherein
the logic chip is attached to the substrate through an adhesion layer, and
the logic chip is mounted on the substrate through a connection wire that connects a top surface of the logic chip to a top surface of the substrate.

15. A semiconductor package, comprising:
a substrate including a through hole;
a chip stack on the substrate; and
a first transparent substrate on the chip stack,
wherein the chip stack includes,
a first semiconductor chip on a top surface of the substrate;
a second semiconductor chip on the first semiconductor chip, the second semiconductor chip on a first surface of the first semiconductor chip, the first surface including an integrated circuit thereon; and
a third semiconductor chip on a second surface of the first semiconductor chip, the second surface of the first semiconductor chip being opposite to the first surface of the first semiconductor chip, the third semiconductor chip penetrating a central portion of the substrate and being exposed by a bottom surface of the substrate,
wherein a first pad of the first semiconductor chip is in direct contact with a second pad of the second semiconductor chip,
wherein the third semiconductor chip is coupled to the first surface of the first semiconductor chip through a first via that vertically penetrates the first semiconductor chip,
wherein the first semiconductor chip includes a logic chip, and
wherein the second semiconductor chip includes an image sensing chip,
wherein the third semiconductor chip is entirely within the through hole on the second surface of the first semiconductor chip, when viewed in a plan view,
wherein the third semiconductor chip has a width less than a width of the first semiconductor chip, and
wherein the logic chip is directly connected to the substrate through a connection terminal.

* * * * *